United States Patent
Chandrashekar et al.

(12)

(10) Patent No.: US 10,580,695 B2
(45) Date of Patent: Mar. 3, 2020

(54) FEATURE FILL WITH NUCLEATION INHIBITION

(71) Applicant: Lam Research Corporation, Fremont, CA (US)

(72) Inventors: Anand Chandrashekar, Fremont, CA (US); Esther Jeng, Los Altos, CA (US); Raashina Humayun, Los Altos, CA (US); Michal Danek, Cupertino, CA (US); Juwen Gao, San Jose, CA (US); Deqi Wang, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/991,413

(22) Filed: May 29, 2018

(65) Prior Publication Data

US 2018/0277431 A1 Sep. 27, 2018

Related U.S. Application Data

(62) Division of application No. 14/866,621, filed on Sep. 25, 2015, now Pat. No. 9,997,405.

(Continued)

(51) Int. Cl.
  *H01L 21/768* (2006.01)
  *H01L 21/285* (2006.01)
  (Continued)

(52) U.S. Cl.
  CPC ........ *H01L 21/76879* (2013.01); *C23C 16/00* (2013.01); *C23C 16/045* (2013.01);
  (Continued)

(58) Field of Classification Search
  CPC ......... H01L 21/76879; H01L 21/76898; H01L 21/76876; H01L 21/76861;
  (Continued)

(56) References Cited

U.S. PATENT DOCUMENTS 4,714,520 A  12/1987 Gwozdz
4,746,375 A   5/1988 Iacovangelo
(Continued)

FOREIGN PATENT DOCUMENTS

CN  101899649 A  12/2010
CN  102224574 A  10/2011
(Continued)

OTHER PUBLICATIONS

U.S. Office Action dated Sep. 3, 2015 issued in U.S. Appl. No. 14/465,610.
(Continued)

*Primary Examiner* — Syed I Gheyas
(74) *Attorney, Agent, or Firm* — Weaver Austin Villeneuve & Sampson LLP

(57) ABSTRACT

Described herein are methods of filling features with tungsten, and related systems and apparatus, involving inhibition of tungsten nucleation. In some embodiments, the methods involve selective inhibition along a feature profile. Methods of selectively inhibiting tungsten nucleation can include exposing the feature to a direct or remote plasma. Pre-inhibition and post-inhibition treatments are used to modulate the inhibition effect, facilitating feature fill using inhibition across a wide process window. The methods described herein can be used to fill vertical features, such as in tungsten vias, and horizontal features, such as vertical NAND (VNAND) wordlines. The methods may be used for both conformal fill and bottom-up/inside-out fill. Examples of applications include logic and memory contact fill, DRAM buried wordline fill, vertically integrated memory gate and wordline fill, and 3-D integration using through-silicon vias.

13 Claims, 22 Drawing Sheets

Related U.S. Application Data

(60) Provisional application No. 62/058,058, filed on Sep. 30, 2014.

(51) Int. Cl.
*H01L 21/321* (2006.01)
*H01L 21/324* (2006.01)
*H01L 27/11524* (2017.01)
*H01L 27/11556* (2017.01)
*C23C 16/04* (2006.01)
*C23C 16/50* (2006.01)
*C23C 16/00* (2006.01)

(52) U.S. Cl.
CPC ........ *C23C 16/50* (2013.01); *H01L 21/28556* (2013.01); *H01L 21/321* (2013.01); *H01L 21/324* (2013.01); *H01L 21/76856* (2013.01); *H01L 21/76861* (2013.01); *H01L 21/76876* (2013.01); *H01L 21/76898* (2013.01); *H01L 27/11524* (2013.01); *H01L 27/11556* (2013.01); *H01L 2924/0002* (2013.01)

(58) Field of Classification Search
CPC ......... H01L 21/76856; H01L 27/11556; H01L 27/11524; H01L 21/28556; H01L 21/324; H01L 21/321; H01L 2924/0002; C23C 16/50; C23C 16/045; C23C 16/00
See application file for complete search history.

(56) References Cited

U.S. PATENT DOCUMENTS

| | | |
|---|---|---|
| 5,112,439 A | 5/1992 | Reisman et al. |
| 5,250,467 A | 10/1993 | Somekh et al. |
| 5,370,739 A | 12/1994 | Foster et al. |
| 5,391,394 A | 2/1995 | Hansen |
| 5,407,698 A | 4/1995 | Emesh |
| 5,489,552 A | 2/1996 | Merchant et al. |
| 5,719,410 A | 2/1998 | Suehiro et al. |
| 5,785,796 A | 7/1998 | Lee |
| 5,804,249 A | 9/1998 | Sukharev et al. |
| 5,866,483 A | 2/1999 | Shiau et al. |
| 5,963,827 A | 10/1999 | Enomoto et al. |
| 5,963,833 A | 10/1999 | Thakur |
| 6,001,729 A | 12/1999 | Shinriki et al. |
| 6,013,575 A | 1/2000 | Itoh |
| 6,017,818 A | 1/2000 | Lu |
| 6,034,419 A | 3/2000 | Nicholls et al. |
| 6,037,263 A | 3/2000 | Chang |
| 6,066,366 A | 5/2000 | Berenbaum et al. |
| 6,100,193 A | 8/2000 | Suehiro et al. |
| 6,107,200 A | 8/2000 | Takagi et al. |
| 6,143,082 A | 11/2000 | McInerney et al. |
| 6,184,158 B1 | 2/2001 | Shufflebotham et al. |
| 6,355,558 B1 | 3/2002 | Dixit et al. |
| 6,432,830 B1 | 8/2002 | Merry |
| 6,503,843 B1 | 1/2003 | Xia et al. |
| 6,566,250 B1 | 5/2003 | Tu et al. |
| 6,696,337 B2 | 2/2004 | Asano et al. |
| 6,861,356 B2 | 3/2005 | Matsuse et al. |
| 6,902,763 B1 | 6/2005 | Elers et al. |
| 6,903,016 B2 | 6/2005 | Cohen |
| 7,005,372 B2 | 2/2006 | Levy et al. |
| 7,141,494 B2 | 11/2006 | Lee et al. |
| 7,355,254 B2 | 4/2008 | Datta et al. |
| 7,501,343 B2 | 3/2009 | Byun et al. |
| 7,501,344 B2 | 3/2009 | Byun et al. |
| 7,655,567 B1 | 2/2010 | Gao et al. |
| 7,691,749 B2 | 4/2010 | Levy et al. |
| 8,119,527 B1 | 2/2012 | Chandrashekar et al. |
| 8,124,531 B2 | 2/2012 | Chandrashekar et al. |
| 8,258,057 B2 | 9/2012 | Kuhn et al. |
| 8,409,985 B2 | 4/2013 | Chan et al. |
| 8,435,894 B2 | 5/2013 | Chandrashekar et al. |
| 8,551,885 B2 | 10/2013 | Chen et al. |
| 8,835,317 B2 | 9/2014 | Chandrashekar et al. |
| 8,853,080 B2 | 10/2014 | Guan et al. |
| 8,975,184 B2 | 3/2015 | Chen et al. |
| 9,034,768 B2 | 5/2015 | Chandrashekar et al. |
| 9,240,347 B2 | 1/2016 | Chandrashekar et al. |
| 9,349,637 B2 | 5/2016 | Na et al. |
| 9,653,353 B2 | 5/2017 | Chandrashekar et al. |
| 9,748,137 B2 | 8/2017 | Lai et al. |
| 9,997,405 B2 | 6/2018 | Chandrashekar et al. |
| 10,103,058 B2 | 10/2018 | Chandrashekar et al. |
| 10,170,320 B2 | 1/2019 | Wang et al. |
| 10,211,099 B2 | 2/2019 | Wang et al. |
| 10,242,879 B2 | 3/2019 | Na et al. |
| 10,256,142 B2 | 4/2019 | Chandrashekar et al. |
| 2001/0044041 A1 | 11/2001 | Badding et al. |
| 2002/0037630 A1 | 3/2002 | Agarwal et al. |
| 2002/0090811 A1 | 7/2002 | Kim et al. |
| 2002/0132472 A1 | 9/2002 | Park |
| 2002/0155722 A1 | 10/2002 | Satta et al. |
| 2002/0177316 A1 | 11/2002 | Miller et al. |
| 2003/0082902 A1 | 5/2003 | Fukui et al. |
| 2003/0091870 A1 | 5/2003 | Bhowmik et al. |
| 2003/0129828 A1 | 7/2003 | Cohen et al. |
| 2003/0190802 A1 | 10/2003 | Wang et al. |
| 2003/0194850 A1 | 10/2003 | Lewis et al. |
| 2003/0203123 A1 | 10/2003 | Shang et al. |
| 2004/0079632 A1 | 4/2004 | Ahmad et al. |
| 2004/0142557 A1 | 7/2004 | Levy et al. |
| 2004/0149386 A1 | 8/2004 | Numasawa et al. |
| 2004/0206267 A1 | 10/2004 | Sambasivan et al. |
| 2004/0245091 A1 | 12/2004 | Karim et al. |
| 2005/0014365 A1 | 1/2005 | Moon et al. |
| 2005/0031786 A1 | 2/2005 | Lee et al. |
| 2005/0059236 A1 | 3/2005 | Nishida et al. |
| 2005/0179141 A1 | 8/2005 | Yun et al. |
| 2006/0075966 A1 | 4/2006 | Chen et al. |
| 2006/0094238 A1 | 5/2006 | Levy et al. |
| 2006/0145190 A1 | 7/2006 | Salzman et al. |
| 2007/0066060 A1 | 3/2007 | Wang |
| 2007/0099420 A1 | 5/2007 | Dominguez et al. |
| 2007/0166989 A1 | 7/2007 | Fresco et al. |
| 2007/0264105 A1 | 11/2007 | Pharand et al. |
| 2008/0054468 A1 | 3/2008 | Choi et al. |
| 2009/0045517 A1 | 2/2009 | Sugiura et al. |
| 2009/0053426 A1 | 2/2009 | Lu et al. |
| 2009/0053893 A1 | 2/2009 | Khandelwal et al. |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0183984 A1 | 7/2009 | Sakuma et al. |
| 2009/0315154 A1 | 12/2009 | Kirby et al. |
| 2010/0055904 A1 | 3/2010 | Chen et al. |
| 2010/0072623 A1 | 3/2010 | Prindle et al. |
| 2010/0130002 A1 | 5/2010 | Dao et al. |
| 2010/0159694 A1 | 6/2010 | Chandrashekar et al. |
| 2010/0267230 A1 | 10/2010 | Chandrashekar et al. |
| 2010/0267235 A1 | 10/2010 | Chen et al. |
| 2011/0111533 A1 | 5/2011 | Varadarajan et al. |
| 2011/0151670 A1 | 6/2011 | Lee et al. |
| 2011/0159690 A1 | 6/2011 | Chandrashekar et al. |
| 2011/0233778 A1 | 9/2011 | Lee et al. |
| 2011/0236594 A1 | 9/2011 | Haverkamp et al. |
| 2012/0009785 A1 | 1/2012 | Chandrashekar et al. |
| 2012/0077342 A1 | 3/2012 | Gao et al. |
| 2012/0115329 A1 | 5/2012 | Chandrashekar et al. |
| 2012/0177845 A1 | 7/2012 | Odedra et al. |
| 2012/0294874 A1 | 11/2012 | Macary et al. |
| 2013/0062677 A1 | 3/2013 | Li et al. |
| 2013/0171822 A1 | 7/2013 | Chandrashekar et al. |
| 2013/0260555 A1 | 10/2013 | Zope et al. |
| 2013/0302980 A1 | 11/2013 | Chandrashekar et al. |
| 2013/0330926 A1 | 12/2013 | Chandrashekar et al. |
| 2014/0030889 A1 | 1/2014 | Chen et al. |
| 2014/0073135 A1 | 3/2014 | Guan et al. |
| 2014/0106083 A1 | 4/2014 | Wu et al. |
| 2014/0231896 A1 | 8/2014 | Matsumori et al. |
| 2014/0264932 A1 | 9/2014 | Ting et al. |
| 2014/0349477 A1 | 11/2014 | Chandrashekar et al. |

(56) References Cited

U.S. PATENT DOCUMENTS

| | | | |
|---|---|---|---|
| 2015/0024592 A1 | 1/2015 | Chandrashekar et al. |
| 2015/0056803 A1 | 2/2015 | Chandrashekar et al. |
| 2015/0093890 A1 | 4/2015 | Blackwell et al. |
| 2015/0162214 A1 | 6/2015 | Thompson et al. |
| 2015/0294906 A1 | 10/2015 | Wu et al. |
| 2015/0361547 A1 | 12/2015 | Lin et al. |
| 2016/0056074 A1 | 2/2016 | Na et al. |
| 2016/0056077 A1 | 2/2016 | Lai et al. |
| 2016/0093528 A1 | 3/2016 | Chandrashekar et al. |
| 2016/0190008 A1 | 6/2016 | Chandrashekar et al. |
| 2016/0293467 A1 | 10/2016 | Caveney et al. |
| 2016/0343612 A1 | 11/2016 | Wang et al. |
| 2017/0278749 A1 | 9/2017 | Chandrashekar et al. |
| 2017/0365513 A1 | 12/2017 | Yang et al. |
| 2018/0053660 A1 | 2/2018 | Jandi et al. |
| 2018/0174901 A1 | 6/2018 | Wang et al. |
| 2018/0308701 A1 | 10/2018 | Na et al. |
| 2019/0019725 A1 | 1/2019 | Chandrashekar et al. |
| 2019/0080914 A1 | 3/2019 | Wang et al. |

FOREIGN PATENT DOCUMENTS

| | | | |
|---|---|---|---|
| CN | 103125013 A | 5/2013 |
| CN | 104272440 A | 1/2015 |
| JP | H2-187031 A | 7/1990 |
| JP | H4-142061 A | 5/1992 |
| JP | H5-226280 A | 9/1993 |
| JP | H07-094488 | 4/1995 |
| JP | H7-147321 A | 6/1995 |
| JP | H07-226393 | 8/1995 |
| JP | 09-022896 A | 1/1997 |
| JP | 2002-016066 A | 1/2002 |
| JP | 2007-251164 | 9/2007 |
| JP | 2008-177577 | 7/2008 |
| JP | 2010-251760 A | 11/2010 |
| JP | 2011-035366 A | 2/2011 |
| KR | 10-2001-0030488 | 4/2001 |
| KR | 10-2006-0087844 | 8/2006 |
| KR | 10-2007-0054100 | 5/2007 |
| KR | 10-2010-0067065 | 6/2010 |
| TW | 2014/05707 A | 2/2014 |
| WO | WO 2013/148444 | 10/2013 |
| WO | WO 2013/148880 | 10/2013 |
| WO | WO 2014/105477 A1 | 7/2014 |

OTHER PUBLICATIONS

U.S. Notice of Allowance dated Jan. 14, 2016 issued in U.S. Appl. No. 14/465,610.
U.S. Office Action dated Nov. 1, 2016 issued in U.S. Appl. No. 14/873,152.
U.S. Notice of Allowance dated Apr. 27, 2017 issued in U.S. Appl. No. 14/873,152.
U.S. Office Action dated May 25, 2016 issued in U.S. Appl. No. 14/866,621.
U.S. Notice of Allowance dated Oct. 21, 2016 issued in U.S. Appl. No. 14/866,621.
U.S. Office Action dated May 18, 2017 issued in U.S. Appl. No. 14/866,621.
U.S. Final Office Action dated Oct. 19, 2017 issued in U.S. Appl. No. 14/866,621.
U.S. Notice of Allowance dated Feb. 13, 2018 issued in U.S. Appl. No. 14/866,621.
U.S. Supplemental Notice of Allowance dated Feb. 23, 2018 issued in U.S. Appl. No. 14/866,621.
U.S. Office Action dated Dec. 15, 2017 issued in U.S. Appl. No. 15/156,129.
U.S. Office Action dated Nov. 25, 2011 issued in U.S. Appl. No. 13/016,656.
U.S. Notice of Allowance dated Jan. 9, 2012 issued in U.S. Appl. No. 13/016,656.
U.S. Office Action, dated Jan. 15, 2015, issued in U.S. Appl. No. 13/774,350.
U.S. Office Action, dated Oct. 8, 2015, issued in U.S. Appl. No. 13/774,350.
U.S. Office Action, dated Jun. 2, 2016, issued in U.S. Appl. No. 13/774,350.
U.S. Final Office Action, dated Jan. 18, 2017, issued in U.S. Appl. No. 13/774,350.
U.S. Office Action, dated Sep. 20, 2017, issued in U.S. Appl. No. 13/774,350.
U.S. Office Action, dated Mar. 26, 2018, issued in U.S. Appl. No. 15/640,940.
U.S. Office Action, dated Dec. 23, 2014, issued in U.S. Appl. No. 13/851,885.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S. Notice of Allowance, dated Mar. 24, 2017, issued in U.S. Appl. No. 13/851,885.
U.S. Office Action, dated Dec. 18, 2014, issued in U.S. Appl. No. 14/502,817.
U.S. Final Office Action, dated Jul. 17, 2015, issued in U.S. Appl. No. 14/502,817.
U.S. Notice of Allowance, dated Sep. 25, 2015, issued in U.S. Appl. No. 14/502,817.
U.S. Office Action, dated Sep. 2, 2016, issued in U.S. Appl. No. 14/965,806.
U.S. Final Office Action, dated Apr. 14, 2017, issued in U.S. Appl. No. 14/965,806.
U.S. Office Action, dated Sep. 11, 2017, issued in U.S. Appl. No. 14/965,806.
U.S. Office Action, dated Dec. 12, 2017, issued in U.S. Appl. No. 15/482,271.
Chinese first Office Action dated Dec. 12, 2017 issued in Application No. CN 201510518752.1.
Chinese first Office Action dated Dec. 20, 2017 issued in Application No. CN 201510644832.1.
Korean Provisional Rejection dated Nov. 16, 2012, issued in Application No. KR 2011-0068603.
Korean Office Action dated Sep. 26, 2016, issued in Application No. KR 10-2013-0054726.
Korean Final Office Action dated May 30, 2017, issued in Application No. KR 10-2013-0054726.
Korean Final Office Action dated Sep. 19, 2017, issued in Application No. KR 10-2013-0054726.
PCT International Search Report and Written Opinion, dated Jun. 28, 2013, issued in PCT/US2013/033174.
PCT International Preliminary Report on Patentability and Written Opinion, dated Oct. 9, 2014, issued in PCT/US2013/033174.
Chinese First Office Action dated Feb. 26, 2016, issued in CN 201380022648.2.
Japanese Office Action dated Jan. 24, 2017, issued in JP 2015-514160.
Taiwan Office Action and Search Report dated Nov. 22, 2016 issued in Application No. TW 102110937.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chinese First Office Action dated Mar. 18, 2016 issued in Application No. CN 201380022693.8.
Chinese Second Office Action dated Jan. 23, 2017 issued in Application No. CN 201380022693.8.
Chinese Third Office Action dated Sep. 25, 2017 issued in Application No. CN 201380022693.8.
Chinese Fourth Office Action dated Mar. 15, 2018 issued in Application No. CN 201380022693.8.
Japanese Notification of Reasons for Rejection dated Dec. 20, 2016 issued in Application No. JP 2015-503547.
Taiwan Office Action dated Oct. 25, 2016 issued in Application No. TW 102110947.

(56) References Cited

OTHER PUBLICATIONS

U.S. Appl. No. 15/384,175, filed Dec. 19, 2016, Wang et al.
U.S. Office Action, dated Nov. 20, 2017, issued in U.S. Appl No. 15/384,175.
U.S. Notice of Allowance dated Aug. 10, 2018 issued in U.S. Appl. No. 15/156,129.
U.S. Final Office Action, dated Jun. 18, 2018, issued in U.S. Appl. No. 15/384,175.
U.S. Notice of Allowance, dated Oct. 3, 2018, issued in U.S. Appl. No. 15/384,175.
U.S. Final Office Action, dated Jul. 6, 2018, issued in U.S. Appl. No. 13/774,350.
U.S. Notice of Allowance, dated Jun. 6, 2018, issued in U.S. Appl. No. 15/482,271.
Chinese Second Office Action dated Aug. 24, 2018 issued in Application No. CN 201510518752.1.
Chinese Second Office Action dated Aug. 17, 2018 issued in Application No. CN 201510644832.1.
Chinese first Office Action dated Jul. 27, 2018 issued in Application No. CN 201610332922.1.
Chinese Fifth Office Action dated Aug. 24, 2018 issued in Application No. CN 201380022693.8.
U.S. Appl. No. 16/124,050, filed Sep. 6, 2018, Chandraskekar et al.
U.S. Office Action dated Apr. 8, 2019 issued in U.S. Appl. No. 16/189,368.
U.S. Office Action dated Dec. 21, 2018 issued in U.S. Appl. No. 15/673,320.
U.S. Office Action dated Mar. 21, 2018 issued in U.S. Appl. No. 15/492,976.
U.S. Final Office Action dated Aug. 13, 2018 issued in U.S. Appl. No. 15/492,976.
U.S. Notice of Allowance dated Nov. 13, 2018 issued in U.S. Appl. No. 15/492,976.
U.S. Notice of Allowance, dated Nov. 30, 2018, issued in U.S. Appl. No. 13/774,350.
U.S. Final Office Action, dated Nov. 2, 2018, issued in U.S. Appl. No. 15/640,940.
U.S. Notice of Allowance, dated Mar. 12, 2019, issued in U.S. Appl. No. 15/640,940.
Chinese Third Office [Decision of Final Rejection] Action dated Mar. 6, 2019 issued in Application No. CN 201510518752.1.
Taiwanese First Office Action dated Apr. 18, 2019 issued in Application No. TW 104127083.
Chinese Third Office Action dated Feb. 14, 2019 issued in Application No. CN 201510644832.1.
Taiwanese First Office Action dated Mar. 28, 2019 issued in Application No. TW 104132010.
U.S. Appl. No. 16/294,736, filed Mar. 6, 2019, Chandrashekar et al.

FEATURE FILL WITH NUCLEATION INHIBITION

CROSS REFERENCE TO RELATED APPLICATION

This application is a divisional of and claims priority to U.S. application Ser. No. 14/866,621, titled "FEATURE FILL WITH NUCLEATION INHIBITION," filed Sep. 25, 2015, which claims the benefit of U.S. Provisional Application No. 62/058,058, titled "FEATURE FILL WITH NUCLEATION INHIBITION," filed Sep. 30, 2014, each of which is incorporated herein by this reference and for all purposes.

BACKGROUND

Deposition of conductive materials using chemical vapor deposition (CVD) techniques is an integral part of many semiconductor fabrication processes. These materials may be used for horizontal interconnects, vias between adjacent metal layers, contacts between first metal layers and devices on the silicon substrate, and high aspect ratio features. In a conventional tungsten deposition process, a substrate is heated to a predetermined process temperature in a deposition chamber, and a thin layer of tungsten-containing materials that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing tungsten-containing materials into small and, especially, high aspect ratio, features may cause formation of seams and voids inside the filled features. Large seams may lead to high resistance, contamination, loss of filled materials, and otherwise degrade performance of integrated circuits. For example, a seam may extend close to the field region after filling process and then open during chemical-mechanical planarization.

SUMMARY

Described herein are methods of filling features with tungsten, and related systems and apparatus, involving inhibition of tungsten nucleation. In some embodiments, the methods involve selective inhibition along a feature profile. Methods of selectively inhibiting tungsten nucleation can include exposing the feature to a direct or remote plasma. Pre-inhibition and post-inhibition treatments are used to modulate the inhibition effect, facilitating feature fill using inhibition across a wide process window. The methods described herein can be used to fill vertical features, such as in tungsten vias, and horizontal features, such as vertical NAND (VNAND) wordlines. The methods may be used for both conformal fill and bottom-up/inside-out fill. Examples of applications include logic and memory contact fill, DRAM buried wordline fill, vertically integrated memory gate and wordline fill, and 3-D integration using through-silicon vias.

One aspect relates to a method including providing a substrate including a feature having one or more feature openings and a feature interior; selectively inhibiting tungsten nucleation in the feature such that there is a differential inhibition profile along a feature axis; modulating the differential inhibition profile to form a modified differential inhibition profile; and selectively depositing tungsten in the feature in accordance with the modified differential inhibition profile.

In some embodiments, selectively inhibiting tungsten nucleation in the feature includes exposing the feature to a direct plasma while applying a bias to the substrate. A direct plasma may include one or more of nitrogen, hydrogen, oxygen and carbon activated species. In some embodiments, the plasma is nitrogen-based and/or hydrogen-based. In some embodiments, selectively inhibiting tungsten nucleation in the feature includes exposing the feature to a remotely-generated plasma. In some embodiments, the method involves depositing a tungsten layer in the feature prior to selective inhibition.

Examples of modulating the differential inhibition profile include soaking the feature in a reducing agent or tungsten-containing agent, annealing the substrate, exposing the feature to a hydrogen-containing plasma, and exposing the substrate to a sputtering gas.

In some embodiments, the methods involve, after selectively depositing tungsten in the feature, non-selectively depositing tungsten in the feature. Transitioning from selective to non-selective deposition may involve allowing a CVD process to continue without deposition of an intervening tungsten nucleation layer. Transitioning from selective to non-selective deposition may involve deposition of a tungsten nucleation layer on the selectively deposited tungsten.

In some embodiments, selectively inhibiting tungsten nucleation includes treating a tungsten surface of the feature. In some embodiments, selectively inhibiting tungsten nucleation includes treating a metal nitride surface of the feature.

In some embodiments selective inhibition is performed without etching material in the feature. In some embodiments, feature fill is performed without etching material in the feature. The feature may be part of a 3-D structure.

In some embodiments, the method includes repeating a cycle of selective inhibition and selective deposition one or more times to fill the feature.

In some embodiments, selectively inhibiting tungsten nucleation in the feature includes exposing the feature to a direct plasma while applying a bias to the substrate. A direct plasma may include one or more of nitrogen, hydrogen, oxygen and carbon activated species. In some embodiments, the plasma is nitrogen-based and/or hydrogen-based. In some embodiments, selectively inhibiting tungsten nucleation in the feature includes exposing the feature to a remotely-generated plasma. In some embodiments, the method involves depositing a tungsten layer in the feature prior to selective inhibition.

Examples of modulating the differential inhibition profile include soaking the feature in a reducing agent or tungsten-containing agent, annealing the substrate, exposing the feature to a hydrogen-containing plasma, and exposing the substrate to a sputtering gas.

In some embodiments, the methods involve, after selectively depositing tungsten in the feature, non-selectively depositing tungsten in the feature. Transitioning from selective to non-selective deposition may involve allowing a CVD process to continue without deposition of an intervening tungsten nucleation layer. Transitioning from selective to non-selective deposition may involve deposition of a tungsten nucleation layer on the selectively deposited tungsten.

In some embodiments, selectively inhibiting tungsten nucleation includes treating a tungsten surface of the feature. In some embodiments, selectively inhibiting tungsten nucleation includes treating a metal nitride surface of the feature.

In some embodiments selective inhibition is performed without etching material in the feature. In some embodiments, feature fill is performed without etching material in the feature. The feature may be part of a 3-D structure.

In some embodiments, the method includes repeating a cycle of selective inhibition and selective deposition one or more times to fill the feature.

In some embodiments, selectively inhibiting tungsten nucleation in the feature includes exposing the feature to a direct plasma while applying a bias to the substrate. A direct plasma may include one or more of nitrogen, hydrogen, oxygen and carbon activated species. In some embodiments, the plasma is nitrogen-based and/or hydrogen-based. In some embodiments, selectively inhibiting tungsten nucleation in the feature includes exposing the feature to a remotely-generated plasma. In some embodiments, the method involves depositing a tungsten layer in the feature prior to selective inhibition.

Examples of modulating the differential inhibition profile include soaking the feature in a reducing agent or tungsten-containing agent, annealing the substrate, exposing the feature to a hydrogen-containing plasma, and exposing the substrate to a sputtering gas.

In some embodiments, the methods involve, after selectively depositing tungsten in the feature, non-selectively depositing tungsten in the feature. Transitioning from selective to non-selective deposition may involve allowing a CVD process to continue without deposition of an intervening tungsten nucleation layer. Transitioning from selective to non-selective deposition may involve deposition of a tungsten nucleation layer on the selectively deposited tungsten.

In some embodiments, selectively inhibiting tungsten nucleation includes treating a tungsten surface of the feature. In some embodiments, selectively inhibiting tungsten nucleation includes treating a metal nitride surface of the feature.

In some embodiments selective inhibition is performed without etching material in the feature. In some embodiments, feature fill is performed without etching material in the feature. The feature may be part of a 3-D structure.

In some embodiments, the method includes repeating a cycle of selective inhibition and selective deposition one or more times to fill the feature.

In some embodiments, selectively inhibiting tungsten nucleation in the feature includes exposing the feature to a direct plasma while applying a bias to the substrate. A direct plasma may include one or more of nitrogen, hydrogen, oxygen and carbon activated species. In some embodiments, the plasma is nitrogen-based and/or hydrogen-based. In some embodiments, selectively inhibiting tungsten nucleation in the feature includes exposing the feature to a remotely-generated plasma. In some embodiments, the method involves depositing a tungsten layer in the feature prior to selective inhibition.

Examples of modulating the differential inhibition profile include soaking the feature in a reducing agent or tungsten-containing agent, annealing the substrate, exposing the feature to a hydrogen-containing plasma, and exposing the substrate to a sputtering gas.

In some embodiments, the methods involve, after selectively depositing tungsten in the feature, non-selectively depositing tungsten in the feature. Transitioning from selective to non-selective deposition may involve allowing a CVD process to continue without deposition of an intervening tungsten nucleation layer. Transitioning from selective to non-selective deposition may involve deposition of a tungsten nucleation layer on the selectively deposited tungsten.

In some embodiments, selectively inhibiting tungsten nucleation includes treating a tungsten surface of the feature. In some embodiments, selectively inhibiting tungsten nucleation includes treating a metal nitride surface of the feature.

In some embodiments selective inhibition is performed without etching material in the feature. In some embodiments, feature fill is performed without etching material in the feature. The feature may be part of a 3-D structure.

In some embodiments, the method includes repeating a cycle of selective inhibition and selective deposition one or more times to fill the feature.

Another aspect involves a method including providing a substrate including a feature having one or more feature openings and a feature interior; exposing the feature to one of: an oxidizing environment, a vacuum break, a reducing agent soak, or a tungsten-containing agent soak; after exposing the feature, selectively inhibiting tungsten nucleation in the feature such that there is a differential inhibition profile along a feature axis; and selectively depositing tungsten in the feature in accordance with the modified differential inhibition profile.

In some embodiments, selectively inhibiting tungsten nucleation in the feature includes exposing the feature to a direct plasma while applying a bias to the substrate. The plasma may contains one or more of nitrogen, hydrogen, oxygen and carbon activated species.

The plasma may be nitrogen-based or hydrogen-based in some embodiments.

In some embodiments, selectively inhibiting tungsten nucleation in the feature includes exposing the feature to a remotely-generated plasma. The method may further involve depositing a tungsten layer in the feature prior to selective inhibition.

In some embodiments, exposing the feature includes soaking the feature in a reducing agent or tungsten-containing agent.

In some embodiments, the method involves modulating the differential inhibition profile.

In some embodiments, the method involves, after selectively depositing tungsten in the feature, depositing tungsten in the feature to complete feature fill.

In some embodiments, the method involves, after selectively depositing tungsten in the feature, non-selectively depositing tungsten in the feature. Transitioning from selective to non-selective deposition may involve allowing a CVD process to continue without deposition of an intervening tungsten nucleation layer. Transitioning from selective to non-selective deposition may involve deposition of a tungsten nucleation layer on the selectively deposited tungsten.

In some embodiments, selectively inhibiting tungsten nucleation includes treating a tungsten surface of the feature. In some embodiments, selectively inhibiting tungsten nucleation includes treating a metal nitride surface of the feature.

In some embodiments selective inhibition is performed without etching material in the feature. In some embodiments, feature fill is performed without etching material in the feature. The feature may be part of a 3-D structure.

Another aspect is a method involving, prior to processing a one or more substrates in a tungsten deposition chamber, exposing the tungsten deposition chamber to an inhibition treatment.

Another aspect is an apparatus including one or more chambers configured to support a substrate; an in situ plasma generator configured to generate a plasma in one or more of the chambers; gas inlets configured to direct gas into each of the one or more chambers; and a controller including program instructions for performing any of the methods above.

These and other aspects are described further below with reference to the drawings.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Described herein are methods of filling features with tungsten (W) and related systems and apparatus. Examples of application include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as vertical NAND (VNAND) wordlines. The methods may be used for conformal and bottom-up or inside-out fill.

Figures 1A, 1B:
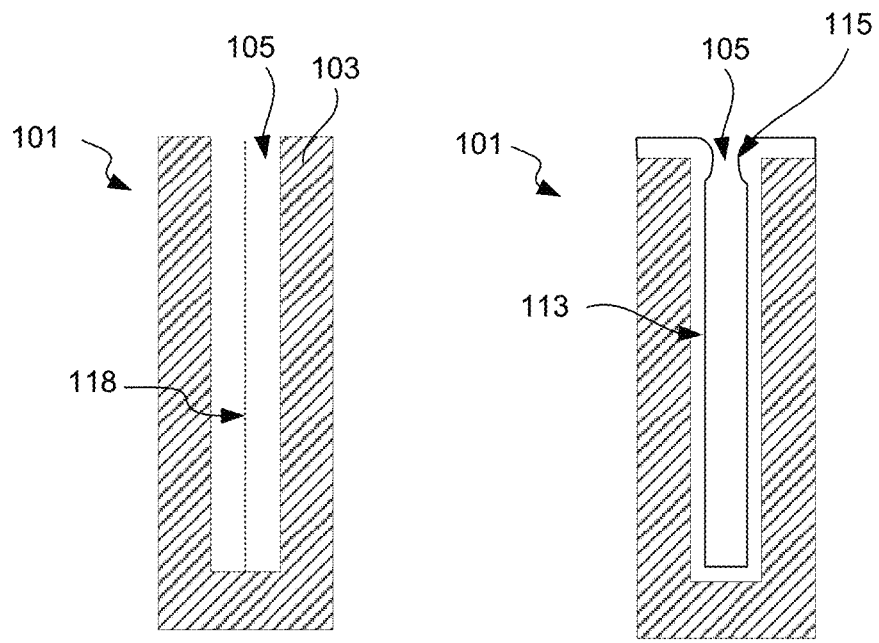
FIGS. 1A-1G show examples of various structures that can be filled according to the processes described herein.
Figure 1D:
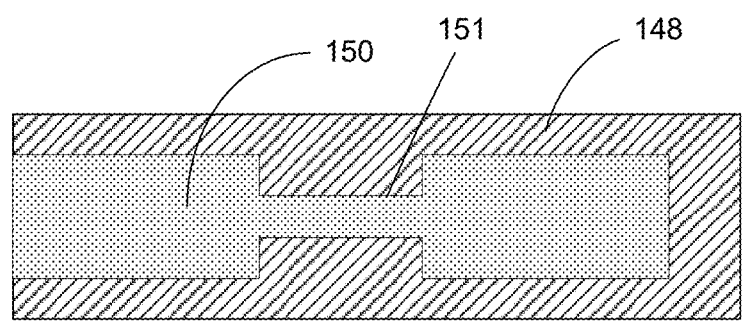
Figure 1C:
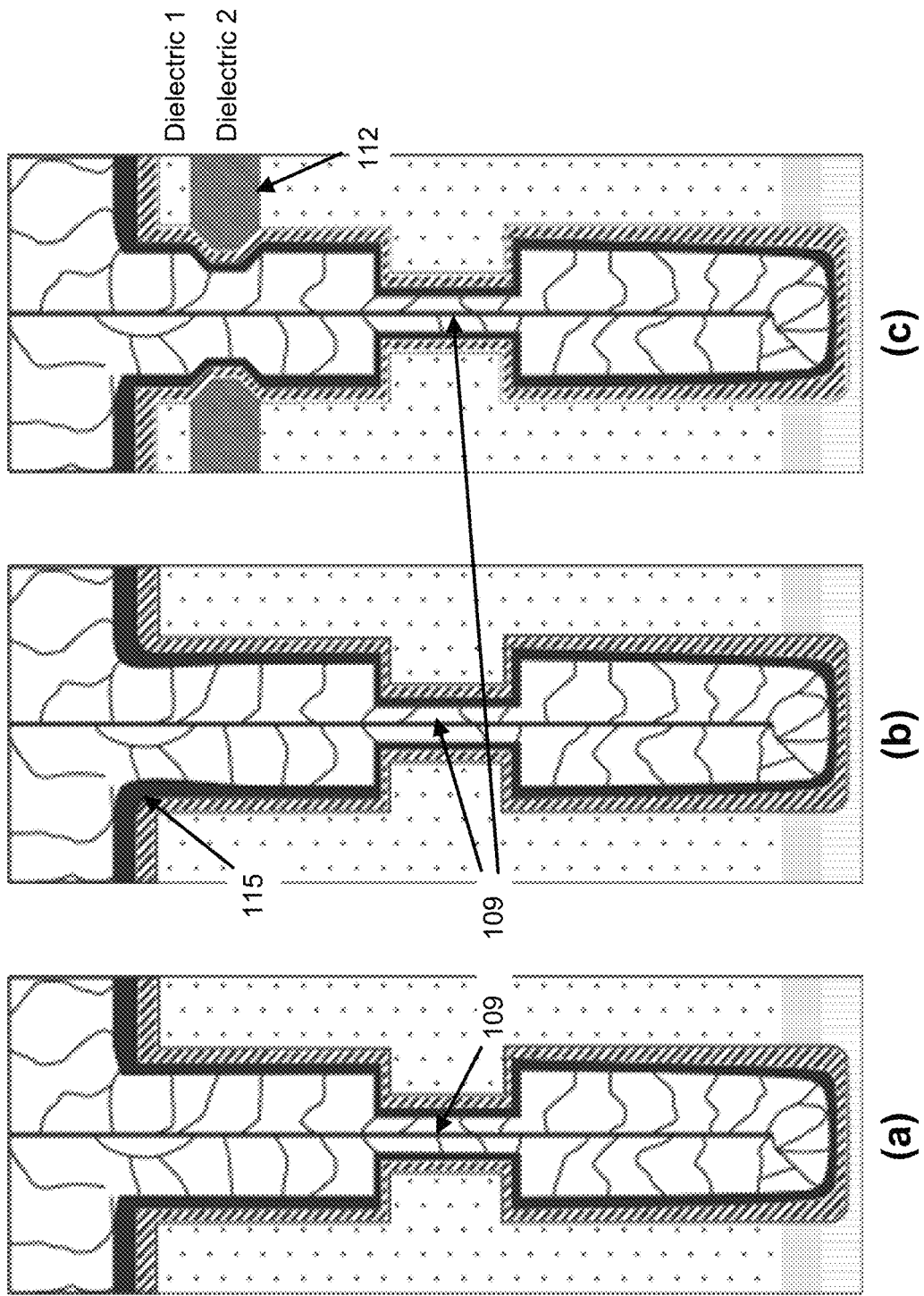

According to various embodiments, a features can be characterized by one or more of narrow and/or re-entrant openings, constrictions within the features, and high aspect ratios. Examples of features that can be filled are depicted in FIGS. 1A-1C. FIG. 1A shows an example of a cross-sectional depiction of a vertical feature 101 to be filled with tungsten. The feature can include a feature hole 105 in a substrate 103. The substrate may be a silicon wafer, e.g., 200-mm wafer, 300-mm wafer, or 450-mm wafer, including wafers having one or more layers of material such as dielectric, conducting, or semi-conducting material deposited thereon. In some embodiments, the feature hole 105 may have an aspect ratio of at least about 2:1, at least about 4:1, at least about 6:1 or higher. The feature hole 105 may also have a dimension near the opening, e.g., an opening diameter or line width, of between about 10 nm to 500 nm. For example, the opening dimension may be between about 25 nm to 300 nm. The feature hole 105 may be referred to as an unfilled feature or simply a feature. The feature, and any feature, may be characterized in part by an axis 118 that extends through the length of the feature, with vertically-oriented features having vertical axes and horizontally-oriented features having horizontal axes.

FIG. 1B shows an example of a feature 101 that has a re-entrant profile. A re-entrant profile is a profile that narrows from a closed bottom end to the feature opening or from an interior of the feature to the feature opening. According to various embodiments, the profile may narrow gradually and/or include an overhang at the feature opening. FIG. 1B shows an example of the latter, with an underlayer 113 lining the interior surfaces of the feature hole 105. The underlayer 113 can be for example, a diffusion barrier layer, an adhesion layer, a nucleation layer, a combination of thereof, or any other appropriate material. Examples of such underlayers include titanium nitride (TiN) underlayers, titanium/titanium nitride (Ti/TiN) underlayers, and tungsten nitride (WN) underlayers. The underlayer 113 forms an overhang 115 such that the underlayer 113 is thicker near the opening of the feature 101 than inside the feature 101.

In some embodiments, features having one or more constrictions within the feature may be filled. FIG. 1C shows examples of views of various filled features having constrictions. Each of the examples (a), (b) and (c) in FIG. 1C includes a constriction 109 at a midpoint of the feature. The constriction 109 can be, for example, between about 15 nm to 20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b). As described further below, methods described herein allow void-free fill as depicted in FIG. 1C.

Figure 1E:
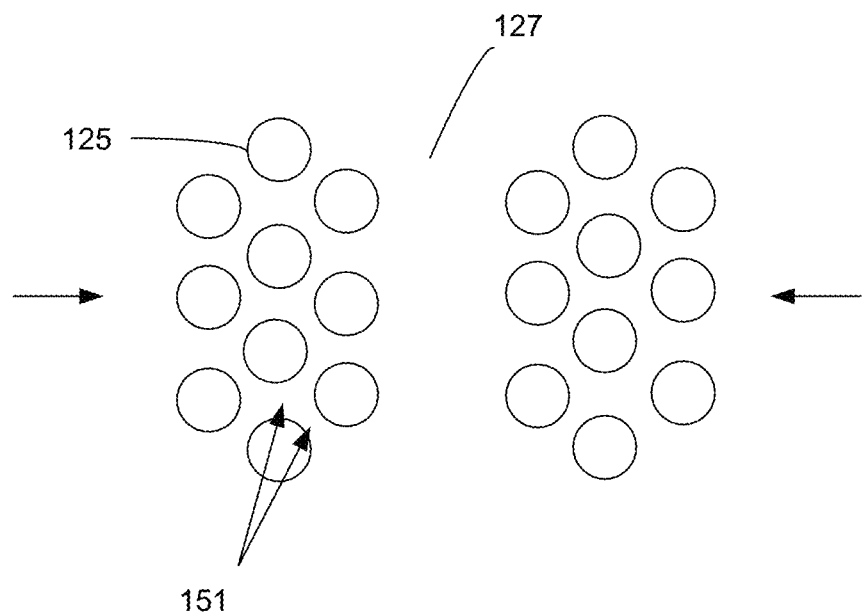
Figure 1F:
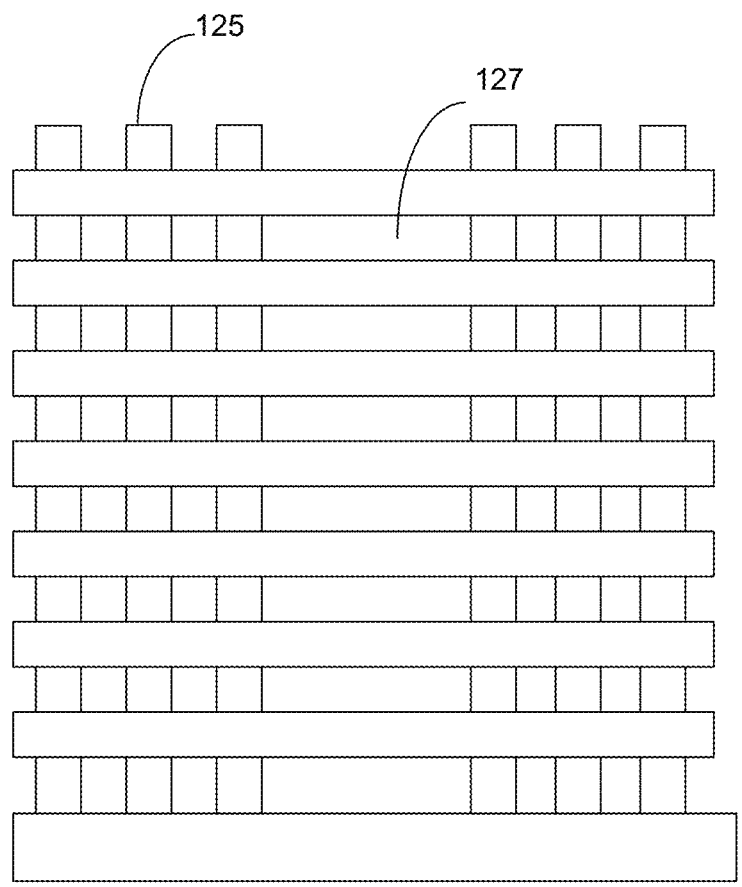

Horizontal features, such as in 3-D memory structures, can also be filled. FIG. 1D shows an example of a word line 150 in a VNAND structure 148 that includes a constriction 151. In some embodiments, the constrictions can be due to the presence of pillars in a VNAND or other structure. FIG. 1E, for example, shows a plan view of pillars 125 in a VNAND structure, with FIG. 1F showing a simplified schematic of a cross-sectional depiction of the pillars 125. Arrows in FIG. 1E represent deposition material; as pillars 125 are disposed between an area 127 and a gas inlet or other deposition source, adjacent pillars can result in constrictions that present challenges in void free fill of the area 127.

Figure 1G:
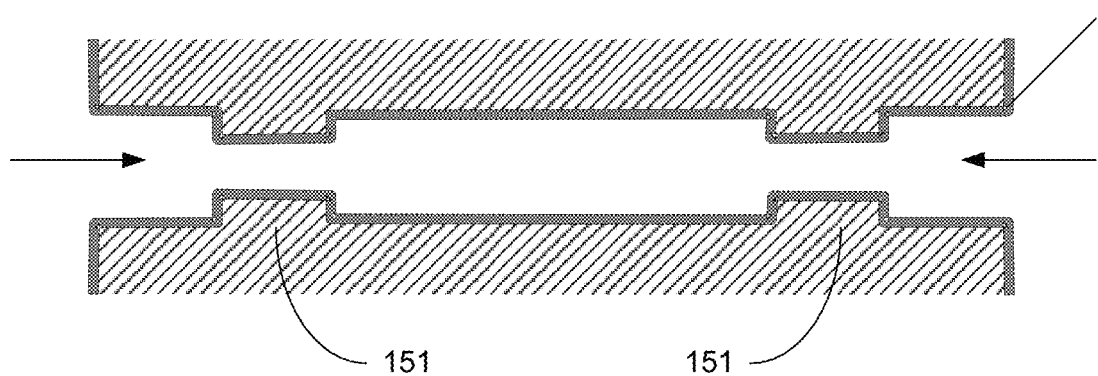

FIG. 1G provides another example of a view horizontal feature, for example, of a VNAND or other structure including pillar constrictions 151. The example in FIG. 1G is open-ended, with material to be deposited able to enter laterally from two sides as indicated by the arrows. (It should be noted that example in FIG. 1G can be seen as a 2-D rendering 3-D features of the structure, with the FIG. 1G being a cross-sectional depiction of an area to be filled and pillar constrictions shown in the figure representing constrictions that would be seen in a plan rather than cross-sectional view.) In some embodiments, 3-D structures can be characterized with the area to be filled extending along three dimensions (e.g., in the X, Y and Z-directions in the example of FIG. 1F), and can present more challenges for fill than filling holes or trenches that extend along one or two dimensions. For example, controlling fill of a 3-D structure can be challenging as deposition gasses may enter a feature from multiple dimensions.

Filling features with tungsten-containing materials may cause formation of voids and seams inside the filled features. A void is region in the feature that is left unfilled. A void can form, for example, when the deposited material forms a pinch point within the feature, sealing off an unfilled space within the feature preventing reactant entry and deposition.

There are multiple potential causes for void and seam formation. One is an overhang formed near the feature opening during deposition of tungsten-containing materials or, more typically, other materials, such as a diffusion barrier layer or a nucleation layer. An example of an overhang is shown in FIG. 1B.

Another cause of void or seam formation that is not illustrated in FIG. 1B but that nevertheless may lead to seam formation or enlarging seams is curved sidewalls of feature holes. Features having such curved sidewalls are also referred to as bowed features. In a bowed feature, the cross-sectional dimension of the cavity near the opening is smaller than that inside the feature. Deposition challenges caused by the narrowed openings of bowed features are similar to those caused by overhangs as described above. Constrictions within a feature such as shown in FIGS. 1C, 1D and 1G also present challenges for tungsten fill with few or no voids and seams.

Even if void free fill is achieved, tungsten in the feature may contain a seam running through the axis or middle of the via, trench, line or other feature. This is because tungsten growth can begin at the sidewall and continue until the tungsten grains meet with tungsten growing from the opposite sidewall. This seam can allow for trapping of impurities including fluorine-containing compounds such as hydrofluoric acid (HF). During chemical-mechanical planarization (CMP), coring can also propagate from the seam. According to various embodiments, the methods described herein can reduce or eliminate void and seam formation. The methods described herein may also address one or more of the following:

1) Very challenging profiles: Void free fill can be achieved in most re-entrant features using deposition-etch-deposition (dep-etch-dep) cycles as described in U.S. Pat. No. 8,435,894, incorporated by reference herein. However, depending on the dimensions and geometry, multiple dep-etch-dep cycles may be needed to achieve void-free fill. This can affect process stability and throughput. Embodiments described herein can provide feature fill with fewer or no dep-etch-dep cycles.

2) Small features and liner/barrier impact: In cases where the feature sizes are extremely small, tuning the etch process without impacting the integrity of a liner/barrier underlayer can be very difficult. In some cases intermittent titanium (Ti) attack can occur during a W-selective etch. This may be due to formation of a passivating titanium fluoride ($TiF_x$) layer during the etch.

3) Scattering at W grain boundaries: The presence of multiple W grains inside the feature can result in electron loss due to grain boundary scattering. As a result, actual device performance will be degraded compared to theoretical predictions and blanket wafer results.

4) Reduced via volume for W fill: Especially in smaller and newer features, a significant part of the metal contact is used up by the W barrier (e.g., a TiN or WN, etc. barrier). These films are typically higher resistivity than W and negatively impact electrical characteristics like contact resistance.

Figure 2A:
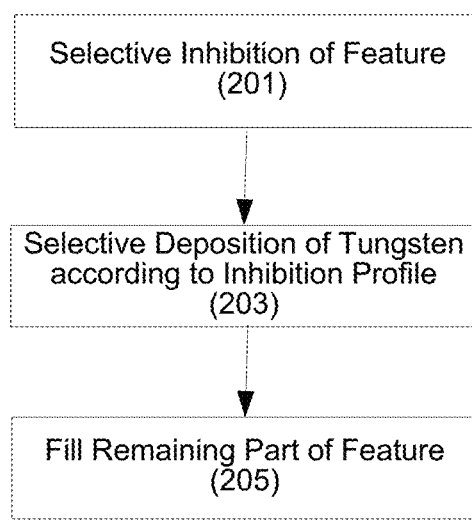
FIGS. 2A-2C are process flow diagrams illustrating certain operations in methods of filling features with tungsten.

FIG. 2A is a process flow diagram illustrating certain operations in a method of filling a feature with tungsten. The method begins at a block 201 with selective inhibition of a feature. Selective inhibition, which may also be referred to as preferential inhibition, preferential passivation, selective passivation, differential inhibition, or differential passivation, involves inhibiting subsequent tungsten nucleation on a portion of the feature, while not inhibiting nucleation (or inhibiting nucleation to a lesser extent) on the remainder of the feature. For example, in some embodiments, a feature is selectively inhibited at a feature opening, while nucleation inside the feature is not inhibited. Selective inhibition is described further below, and can involve, for example, selectively exposing a portion of the feature to activated species of a plasma. In certain embodiments, for example, a feature opening is selectively exposed to a plasma generated from molecular nitrogen gas. As discussed further below, a desired inhibition profile in a feature can be formed by appropriately selecting one or more of inhibition chemistry, substrate bias power, plasma power, process pressure, exposure time, and other process parameters.

Once the feature is selectively inhibited, the method can continue at block 203 with selective deposition of tungsten according to the inhibition profile. Block 203 may involve one or more chemical vapor deposition (CVD) and/or atomic layer deposition (ALD) processes, including thermal and plasma-enhanced CVD and/or ALD processes. The deposition is selective in that the tungsten preferentially grows on the lesser- and non-inhibited portions of the feature. In some embodiments, block 203 involves selectively depositing tungsten in a bottom or interior portion of the feature until a constriction is reached or passed.

After selective deposition according to the inhibition profile is performed, the method can continue at block 205 with filling the rest of the feature. In certain embodiments, block 205 involves a CVD process in which a tungsten-containing precursor is reduced by hydrogen to deposit tungsten. While tungsten hexafluoride ($WF_6$) is often used, the process may be performed with other tungsten precursors, including, but not limited to, tungsten hexachloride ($WCl_6$), organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten). In addition, while hydrogen can be used as the reducing agent in the CVD deposition, other reducing agents including silane may be used in addition or instead of hydrogen. In another embodiment, tungsten hexacarbonyl ($W(CO)_6$) may be used with or without a reducing agent. Unlike with ALD and pulsed nucleation layer (PNL) processes described further below, in a CVD technique, the $WF_6$ and $H_2$ or other reactants are simultaneously introduced into the reaction chamber. This produces a continuous chemical reaction of mix reactant gases that continuously forms tungsten film on the substrate surface. Methods of depositing tungsten films using CVD are described in U.S. Pat. Nos. 8,551,885 and 8,623,733, which are incorporated by reference herein in their entireties for the purposes of describing tungsten deposition processes. According to various embodiments, the methods described herein are not limited to a particular method of filling a feature but may include any appropriate deposition technique.

In some embodiments, block 205 may involve continuing a CVD deposition process started at block 203. Such a CVD process may result in deposition on the inhibited portions of the feature, with nucleation occurring more slowly than on the non-inhibited portions of the feature. In some embodiments, block 205 may involve deposition of a tungsten nucleation layer over at least the inhibited portions of the feature.

Figure 2B:
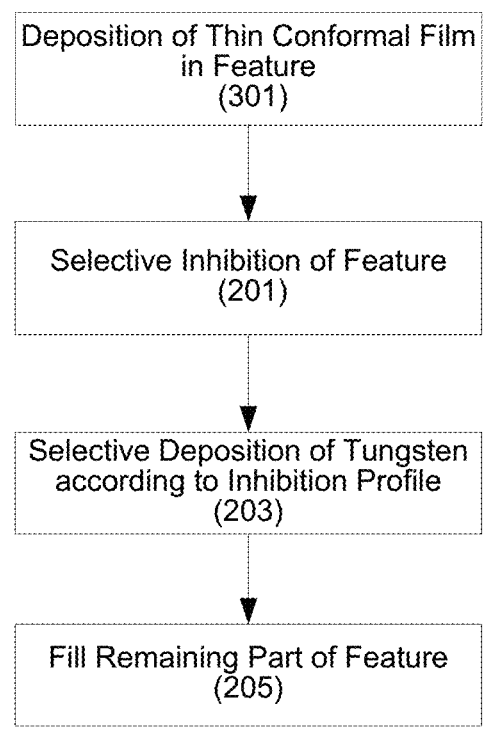

According to various embodiments, the feature surface that is selectively inhibited can be a barrier or liner layer, such as a metal nitride layer, or it can be a layer deposited to promote nucleation of tungsten. FIG. 2B shows an example of a method in which a tungsten nucleation layer is deposited in the feature prior to selective inhibition. The method begins at block 301 with deposition of the thin conformal layer of tungsten in the feature. The layer can facilitate subsequent deposition of bulk tungsten-containing material thereon. In certain embodiments, the nucleation layer is deposited using a PNL technique. In a PNL technique, pulses of a reducing agent, purge gases, and tungsten-containing precursor can be sequentially injected into and purged from the reaction chamber. The process is repeated in a cyclical fashion until the desired thickness is achieved. PNL broadly embodies any cyclical process of sequentially adding reactants for reaction on a semiconductor substrate, including ALD techniques. PNL techniques for depositing tungsten nucleation layers are described in U.S. Pat. Nos. 6,635,965; 7,589,017; 7,141,494; 7,772,114; 8,058,170 and 8,623,733 and in U.S. patent application Ser. No. 12/755,248, which are incorporated by reference herein in their entireties for the purposes of describing tungsten deposition processes. Block 301 is not limited to a particular method of tungsten nucleation layer deposition, but includes PNL, ALD, CVD, and physical vapor deposition (PVD) techniques for depositing a thin conformal layer. The nucleation layer can be sufficiently thick to fully cover the feature to support high quality bulk deposition; however, because the resistivity of the nucleation layer is higher than that of the bulk layer, the thickness of the nucleation layer may be minimized to keep the total resistance as low as possible. Example thicknesses of films deposited in block 301 can range from less than 10 Å to 100 Å. After deposition of the thin conformal layer of tungsten in block 301, the method can continue with blocks 201, 203, and 205 as described above with reference to FIG. 2A. An example of filling a feature according to a method of FIG. 2B is described below with reference to FIG. 5.

In some embodiments, the thickness of the layer deposited in block 301 may be used to modulate the inhibition effect of the subsequent operation. FIG. 2D shows growth delay time (after inhibition) as a function of thickness of tungsten layer deposited prior to the inhibition treatment. The thinner the layer, the stronger the inhibiting effect.

Figure 2C:
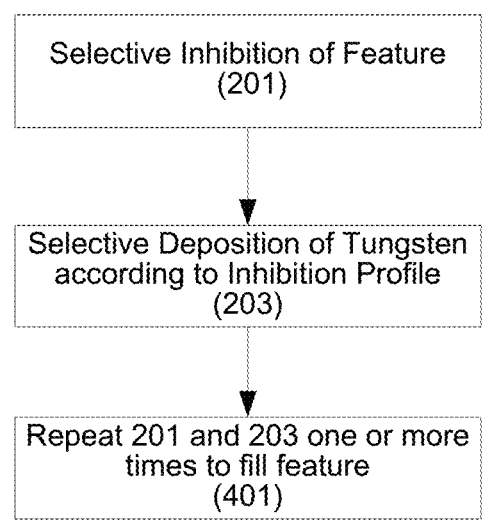
Figure 2D:
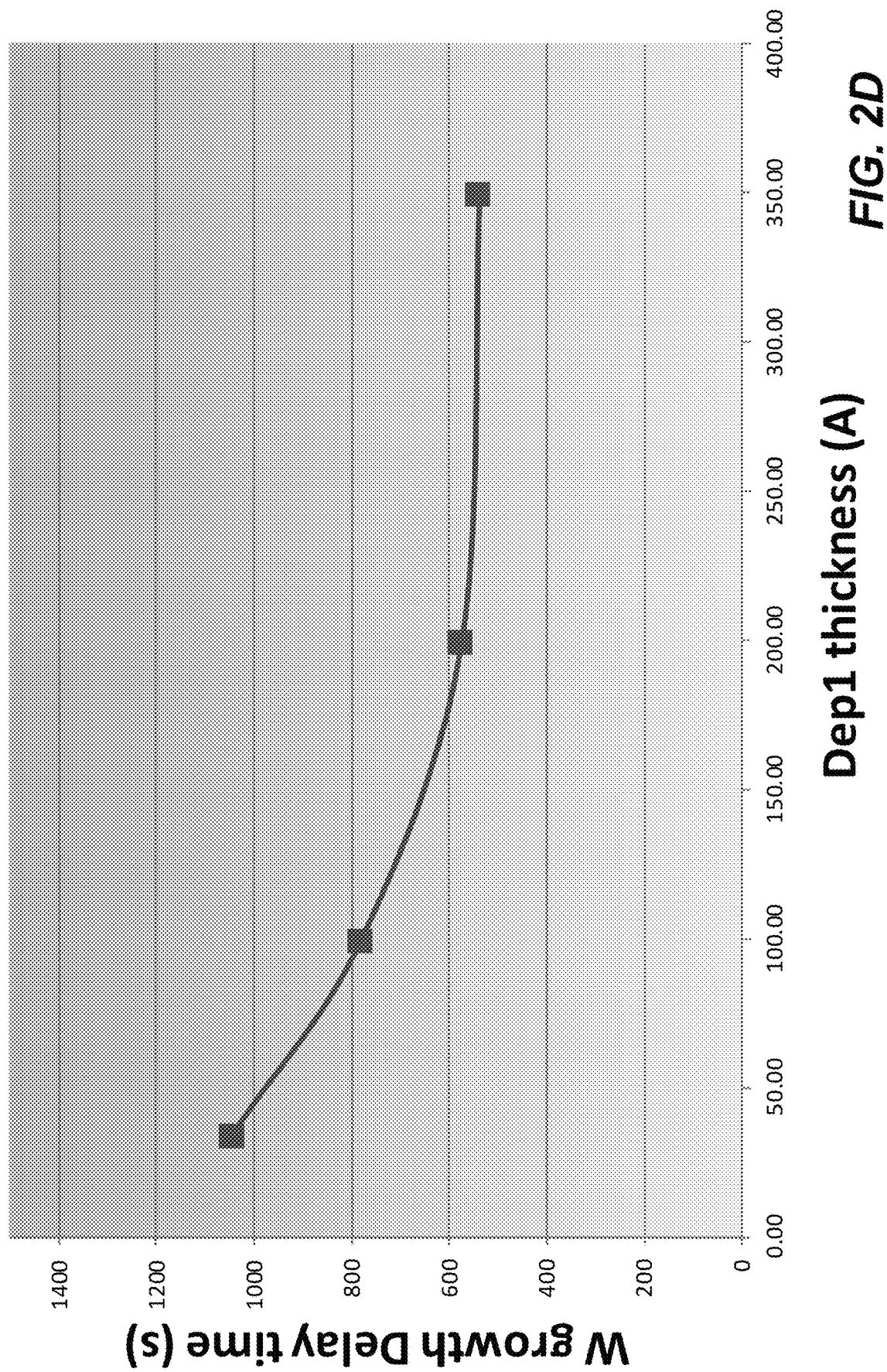
FIG. 2D is a graph showing growth delay time (after inhibition) as a function of thickness of tungsten layer deposited prior to the inhibition treatment.

FIG. 2C shows an example of a method in which completing filling the feature (e.g., block 205 in FIG. 2A) can involve repeating selective inhibition and deposition operations. The method can begin at block 201, as described above with respect to FIG. 2A, in which the feature is selectively inhibited, and continue at block 203 with selective deposition according to the inhibition profile. Blocks 201 and 203 are then repeated one or more times (block 401) to complete feature fill.

Still further, selective inhibition can be used in conjunction with selective deposition. Selective deposition techniques are described in U.S. Provisional Patent Application No. 61/616,377, incorporated by reference herein.

According to various embodiments, selective inhibition can involve exposure to activated species that passivate the feature surfaces. For example, in certain embodiments, a tungsten surface can be passivated by exposure to a nitrogen-based or hydrogen-based plasma. In some embodiments, inhibition can involve a chemical reaction between activated species and the feature surface to form a thin layer of a compound material such as tungsten nitride (WN) or tungsten carbide (WC). In some embodiments, inhibition can involve a surface effect such as adsorption that passivates the surface without forming a layer of a compound material. Activated species may be formed by any appropriate method including by plasma generation and/or exposure to ultraviolet (UV) radiation. In some embodiments, the substrate including the feature is exposed to a plasma generated from one or more gases fed into the chamber in which the substrate sits. In some embodiments, one or more gases may be fed into a remote plasma generator, with activated species formed in the remote plasma generator fed into a chamber in which the substrate sits. The plasma source can be any type of source including radio frequency (RF) plasma source or microwave source. The plasma can be inductively and/or capacitively-coupled. Activated species can include atomic species, radical species, and ionic species. In certain embodiments, exposure to a remotely-generated plasma includes exposure to radical and atomized species, with substantially no ionic species present in the plasma such that the inhibition process is not ion-mediated. In other embodiments, ion species may be present in a remotely-generated plasma. In certain embodiments, exposure to an in-situ plasma involves ion-mediated inhibition. For the purposes of this application, activated species are distinguished from recombined species and from the gases initially fed into a plasma generator.

Inhibition chemistries can be tailored to the surface that will be subsequently exposed to deposition gases. For tungsten surfaces, as formed for example in a method described with reference to FIG. 2B, exposure to nitrogen-based and/or hydrogen-based plasmas inhibits subsequent tungsten deposition on the W surfaces. Other chemistries that may be used for inhibition of tungsten surfaces include oxygen-based plasmas and hydrocarbon-based plasmas. For example, molecular oxygen or methane may be introduced to a plasma generator.

As used herein, a nitrogen-based plasma is a plasma in which the main non-inert component is nitrogen. An inert component such as argon, xenon, or krypton may be used as a carrier gas. In some embodiments, no other non-inert components are present in the gas from which the plasma is generated except in trace amounts. In some embodiments, inhibition chemistries may be nitrogen-containing, hydrogen-containing, oxygen-containing, and/or carbon-containing, with one or more additional reactive species present in the plasma. For example, U.S. Pat. No. 8,124,531, incorporated by reference herein, describes passivation of a tungsten surface by exposure to nitrogen trifluoride ($NF_3$). Similarly, fluorocarbons such as $CF_4$ or $C_2F_8$ may be used. However, in certain embodiments, the inhibition species are fluorine-free to prevent etching during selective inhibition.

In certain embodiments, UV radiation may be used in addition to or instead of plasma to provide activated species. Gases may be exposed to UV light upstream of and/or inside a reaction chamber in which the substrate sits. Moreover, in certain embodiments, non-plasma, non-UV, thermal inhibition processes may be used. In addition to tungsten surfaces, nucleation may be inhibited on liner/barrier layers surfaces such as TiN and/or WN surfaces. Any chemistry that passivates these surfaces may be used. For TiN and WN, this can include exposure to nitrogen-based or nitrogen-containing chemistries. In certain embodiments, the chemistries described above for W may also be employed for TiN, WN, or other liner layer surfaces.

Tuning an inhibition profile can involve appropriately controlling an inhibition chemistry, substrate bias power, plasma power, process pressure, exposure time, and other process parameters. For in-situ plasma processes (or other processes in which ionic species are present), a bias can be applied to the substrate. Substrate bias can, in some embodiments, significantly affect an inhibition profile, with increasing bias power resulting in active species deeper within the feature. For example, 100 W DC bias on a 300 mm substrate may result inhibition the top half of a 1500 nm deep structure, while a 700 W bias may result in inhibition of the entire structure. The absolute bias power appropriate a particular selective inhibition will depend on the substrate size, the system, plasma type, and other process parameters, as well as the desired inhibition profile; however, bias power can be used to tune top-to-bottom selectivity, with decreasing bias power resulting in higher selectivity. For 3-D structures in which selectivity is desired in a lateral direction (tungsten deposition preferred in the interior of the structure), but not in a vertical direction, increased bias power can be used to promote top-to-bottom deposition uniformity.

While bias power can be used in certain embodiments as the primary or only knob to tune an inhibition profile for ionic species, in certain situations, performing selective inhibition uses other parameters in addition to or instead of bias power. These include remotely generated non-ionic plasma processes and non-plasma processes. Also, in many systems, a substrate bias can be easily applied to tune selectivity in vertical but not lateral direction. Accordingly, for 3-D structures in which lateral selectivity is desired, parameters other than bias may be controlled, as described above.

Inhibition chemistry can also be used to tune an inhibition profile, with different ratios of active inhibiting species used. For example, for inhibition of W surfaces, nitrogen may have a stronger inhibiting effect than hydrogen; adjusting the ratio of $N_2$ and $H_2$ gas in a forming gas-based plasma can be used to tune a profile. The plasma power may also be used to tune an inhibition profile, with different ratios of active species tuned by plasma power. Process pressure can be used to tune a profile, as pressure can cause more recombination (deactivating active species) as well as pushing active species further into a feature. Process time may also be used to tune inhibition profiles, with increasing treatment time causing inhibition deeper into a feature.

In some embodiments, selective inhibition can be achieved by performing operation 203 in a mass transport limited regime. In this regime, the inhibition rate inside the feature is limited by amounts of and/or relative compositions of different inhibition material components (e.g., an initial inhibition species, activated inhibition species, and recombined inhibition species) that diffuse into the feature. In certain examples, inhibition rates depend on various components' concentrations at different locations inside the feature.

Mass transport limiting conditions may be characterized, in part, by overall inhibition concentration variations. In certain embodiments, a concentration is less inside the feature than near its opening resulting in a higher inhibition rate near the opening than inside. This in turn leads to selective inhibition near the feature opening. Mass transport limiting process conditions may be achieved by supplying limited amounts of inhibition species into the processing chamber (e.g., use low inhibition gas flow rates relative to the cavity profile and dimensions), while maintaining relative high inhibition rates near the feature opening to consume some activated species as they diffuse into the feature. In certain embodiment, a concentration gradient is substantial, which may be caused relatively high inhibition kinetics and relatively low inhibition supply. In certain embodiments, an inhibition rate near the opening may also be mass transport limited, though this condition is not required to achieve selective inhibition.

In addition to the overall inhibition concentration variations inside features, selective inhibition may be influenced by relative concentrations of different inhibition species throughout the feature. These relative concentrations in turn can depend on relative dynamics of dissociation and recombination processes of the inhibition species. As described above, an initial inhibition material, such as molecular nitrogen, can be passed through a remote plasma generator and/or subjected to an in-situ plasma to generate activated species (e.g., atomic nitrogen, nitrogen ions). However, activated species may recombine into less active recombined species (e.g., nitrogen molecules) and/or react with W, WN, TiN, or other feature surfaces along their diffusion paths. As such, different parts of the feature may be exposed to different concentrations of different inhibition materials, e.g., an initial inhibition gas, activated inhibition species, and recombined inhibition species. This provides additional opportunities for controlling selective inhibition. For example, activated species are generally more reactive than initial inhibition gases and recombined inhibition species. Furthermore, in some cases, the activated species may be less sensitive to temperature variations than the recombined species. Therefore, process conditions may be controlled in such a way that removal is predominantly attributed to activated species. As noted above, some species may be more reactive than others. Furthermore, specific process conditions may result in activated species being present at higher concentrations near features' openings than inside the features. For example, some activated species may be consumed (e.g., reacted with feature surface materials and/or adsorbed on the surface) and/or recombined while diffusing deeper into the features, especially in small high aspect ratio features. Recombination of activated species can also occur outside of features, e.g., in the showerhead or the processing chamber, and can depends on chamber pressure. Therefore, chamber pressure may be controlled to adjust concentrations of activated species at various points of the chamber and features.

Flow rates of the inhibition gas can depend on a size of the chamber, reaction rates, and other parameters. A flow rate can be selected in such a way that more inhibition material is concentrated near the opening than inside the feature. In certain embodiments, these flow rates cause mass-transport limited selective inhibition. For example, a flow rate for a 195-liter chamber per station may be between about 25 sccm and 10,000 sccm or, in specific embodiments, between about 50 sccm and 1,000 sccm. In certain embodiments, the flow rate is less than about 2,000 sccm, less than about 1,000 sccm, or more less than about 500 sccm. It should be noted that these values are presented for one individual station configured for processing a 300-mm substrate. These flow rates can be scaled up or down depending on a substrate size, a number of stations in the apparatus (e.g., quadruple for a four station apparatus), a processing chamber volume, and other factors.

In certain embodiments, the substrate can be heated up or cooled down before selective inhibition. Various devices may be used to bring the substrate to the predetermined temperature, such as a heating or cooling element in a station (e.g., an electrical resistance heater installed in a pedestal or a heat transfer fluid circulated through a pedestal), infrared lamps above the substrate, igniting plasma, etc.

A predetermined temperature for the substrate can be selected to induce a chemical reaction between the feature surface and inhibition species and/or promote adsorption of the inhibition species, as well as to control the rate of the reaction or adsorption. For example, a temperature may be selected to have high reaction rate such that more inhibition occurs near the opening than inside the feature. Furthermore, a temperature may be also selected to control recombination of activated species (e.g., recombination of atomic nitrogen into molecular nitrogen) and/or control which species (e.g., activated or recombined species) contribute predominantly to inhibition. In certain embodiments, a substrate is maintained at less than about 300° C., or more particularly at less than about 250° C., or less than about 150° C., or even less than about 100° C. In other embodiments, a substrate is heated to between about 300° C. and 450° C. or, in more specific embodiments, to between about 350° C. and 400° C. Other temperature ranges may be used for different types of inhibition chemistries. Exposure time can also be selected to cause selective inhibition. Example exposure times can range from about 10 s to 500 s, depending on desired selectivity and feature depth.

Figure 3A:
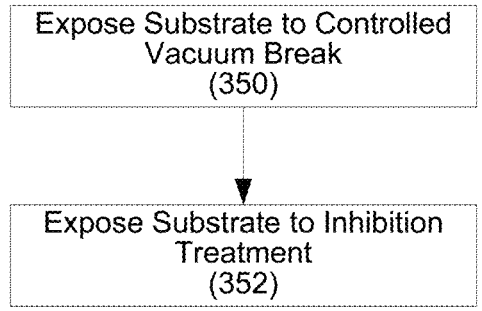
FIGS. 3A-3C, 4A-4D and 4F-4H are process flow diagrams illustrating certain operations in methods of selective inhibition.
Figure 3B:
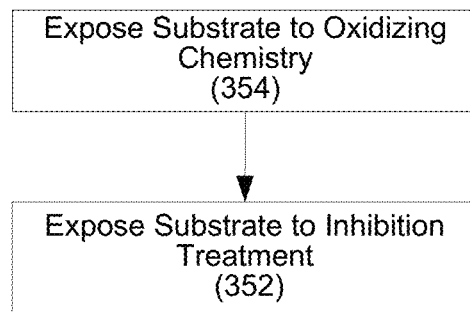
Figure 3C:
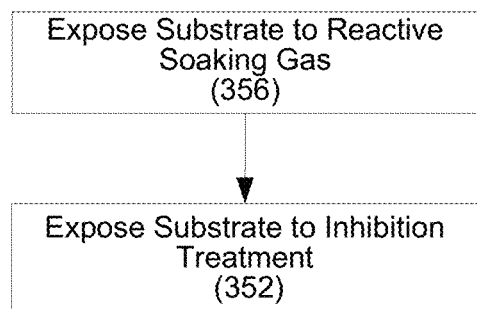

In some embodiments, the inhibition treatments described above are modulated to improve selectivity and tune the inhibition profile. FIGS. 3A-3C and 4A-4D provide examples of flow charts of selectively inhibiting tungsten deposition in a feature. FIGS. 3A-3C provide examples of treating a substrate prior to exposing the substrate to an nitrogen-based plasma or other inhibition chemistry. First, in FIG. 3A, the process begins by exposing a substrate including a feature to a controlled vacuum break (350). As used herein, a vacuum break refers to a period wherein the substrate is not under vacuum. In block 350, the substrate may be exposed to atmospheric pressure, for example, in a storage cassette (e.g., a front opening unified pod or FOUP) or in a loadlock. In some embodiments, the substrate may be exposed to atmospheric temperature and/or gasses (i.e., air). Alternatively, temperature and gas composition may be controlled. The duration of block 350 may be controlled to effectively modulate the subsequent inhibition treatment. Next, the substrate is exposed to an inhibition treatment as discussed above (352). In a particular example, the substrate is exposed to a nitrogen-based plasma. The process shown in FIG. 3A may be performed as part of block 201 in a process as shown in FIGS. 2A-2C. In some embodiments, block 350 is performed after deposition of a thin film in the feature, for example as shown in block 301 of FIG. 2A. In one example, a thin tungsten film may be deposited in a feature in a first vacuum chamber, followed by a controlled vacuum break in a FOUP or loadlock, followed by exposure to a nitrogen-based plasma in a second vacuum chamber.

The process of FIG. 3B is similar to that of FIG. 3A, with a substrate including a feature exposed to an oxidizing chemistry (354). In some embodiments, block 354 may be performed outside a reaction chamber, for example in a FOUP or loadlock. Alternatively, block 354 may involve exposing a substrate to an oxidizing gas, such as oxygen ($O_2$), ozone ($O_3$), carbon dioxide ($CO_2$), water ($H_2O$), etc. in a process chamber. Block 354 may be performed under vacuum or at atmospheric pressure. According to various embodiments, block 354 may or may not involve the use of plasma- or UV-activated species. For example, block 354 may involve exposing the substrate to $O_2$ under non-plasma conditions such that the $O_2$ is not activated. Block 354 is followed by exposing the substrate to an inhibition treatment (352). In a particular example, the substrate is exposed to a nitrogen-based plasma. Blocks 354 and 352 may be performed in the same chamber or different chambers. The process shown in FIG. 3B may be performed as part of block 201 in a process as shown in FIGS. 2A-2C. In some embodiments, block 354 is performed after deposition of a thin film in the feature, for example as shown in block 301 of FIG. 2B.

In some embodiments, block 350 in FIG. 3A or block 354 in FIG. 3B in involves formation of an oxide film in the feature. For example, in implementations in which there is a thin conformal tungsten film deposited in the feature (e.g., as in block 301 of FIG. 2B), tungsten oxide ($WO_x$) may be formed in the feature. In some embodiments, $WO_x$ formation in a feature is non-conformal.

Figure 3D:
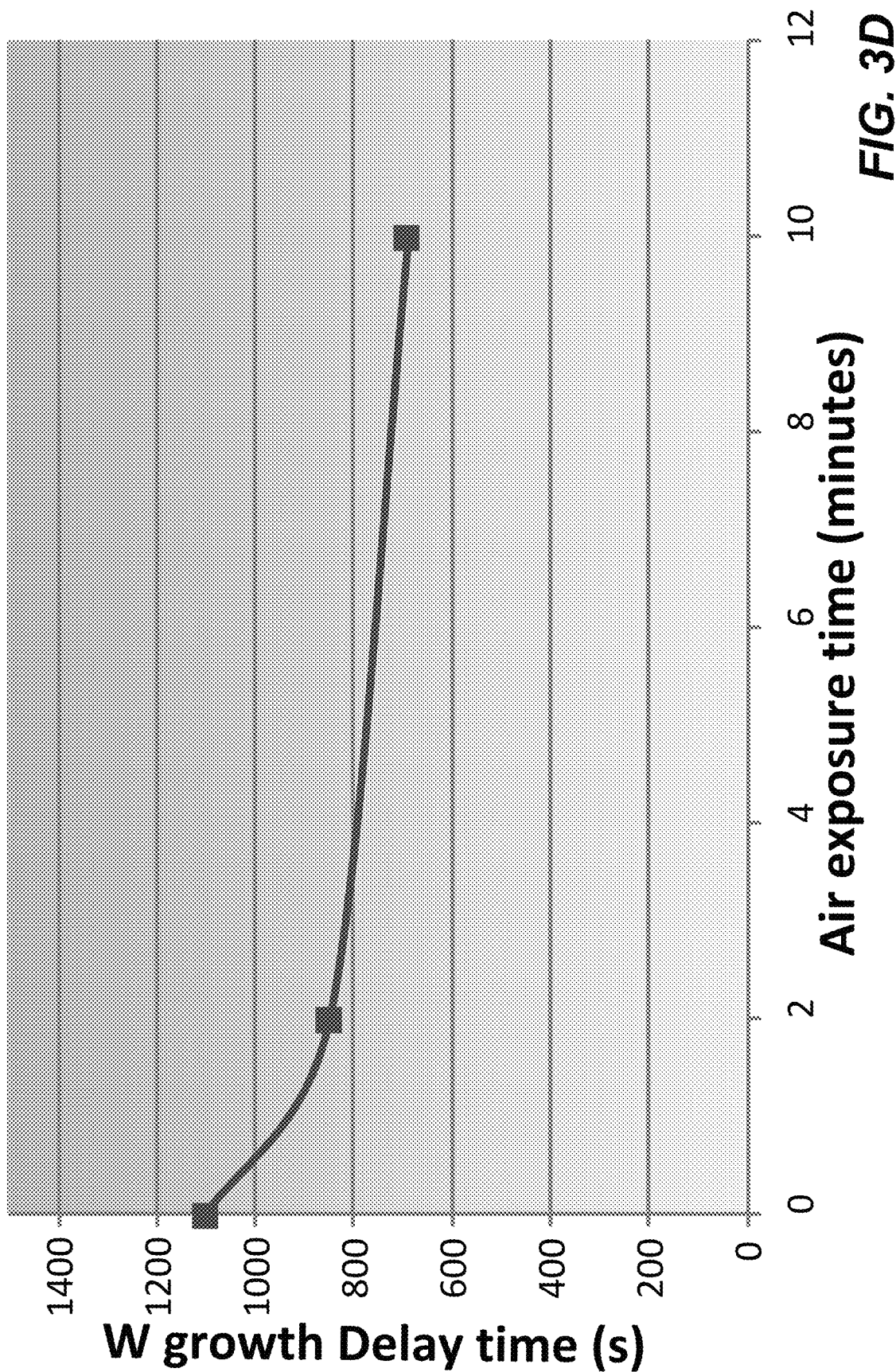
FIG. 3D is a graph showing inhibition modulation as function of pre-inhibition exposure to air duration.

FIG. 3D shows growth delay of a tungsten deposition performed after the following sequence: a) deposition of tungsten layer, b) exposure to air (vacuum break) and c) exposure to a nitrogen-based plasma inhibiting treatment. The delay time is shown as a function of the air exposure time. As shown in FIG. 3D, an air break modulates the inhibition effect of the nitrogen plasma by lessening the effect.

The process of FIG. 3C involves exposing a substrate including a feature to a reactive chemistry (356). Examples of reactive chemistries include reducing chemistries (e.g., diborane ($B_2H_6$) or silane ($SiH_4$)) and tungsten-containing chemistries (e.g., $WF_6$ or $WCl_6$). Block 356 is followed by exposing the substrate to an inhibition treatment (352). In a particular example, the substrate is exposed to a nitrogen-based plasma. Blocks 356 and 352 may be performed in the same chamber or different chambers. The process shown in FIG. 3C may be performed as part of block 201 in a process as shown in FIGS. 2A-2C. In some embodiments, block 356 is performed after deposition of a thin film in the feature, for example as shown in block 301 of FIG. 2B. Block 356 may be referred to as a soak, and is generally a non-plasma operation.

Table 1, below, compares inhibition performed after a diborane soak with inhibition performed after no soak. For both processes, a 100 Å tungsten nucleation layer was deposited, followed by the soak/no soak operation, followed by exposure to a nitrogen plasma. The deposition operation following the inhibition treatment was 300 seconds (including delay).

| Pre-inhibition $B_2H_6$ soaking (seconds) | 300 second W deposition: thickness (Å) | 300 second W deposition: delay (seconds) |
| --- | --- | --- |
| 0 | 897 | 221 |
| 15 | 100 | >300 s |

The results in Table 1 indicate that the $B_2H_6$ rich surface modulates the inhibition effect by increasing it.

FIGS. 4A-4D provide examples of treating a substrate after exposing the substrate to an nitrogen-based plasma or other inhibition chemistry and prior to tungsten deposition. The treatment modulates the inhibition. First, in FIG. 4A, the process includes exposing a substrate including a feature to an inhibition treatment as discussed above (450). In a particular example, the substrate is exposed to a nitrogen-based plasma. Next, the substrate is annealed (452). Block 452 may involve raising the temperature, e.g., by at least 50° C., 100° C. or 200° C. The annealing may be performed in an inert ambient, or in an oxidizing environment, for example. Blocks 450 and 452 may be performed in the same chamber or different chambers. The process shown in FIG. 4A may be performed as part of block 201 in a process as shown in FIGS. 2A-2C. Block 452 may be performed in a chamber where a subsequent tungsten deposition operation is to be performed. In some embodiments, block 450 may be performed as part of block 352 in FIGS. 3A-3C, i.e., after a modulation pretreatment. Block 450 may form a differential inhibition profile along a feature axis, with block 452 forming a modified differential inhibition profile along the feature axis.

Figure 4A:
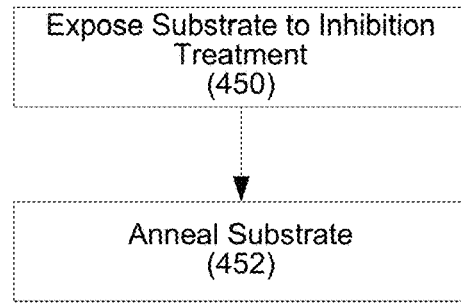
Figure 4B:
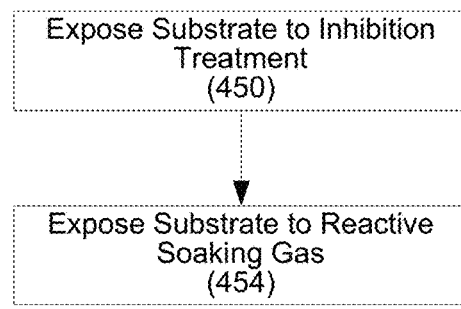

The process of FIG. 4B involves exposing a substrate including a feature to a reactive chemistry (454) after exposing it to an inhibition treatment (450) as described above. Examples of reactive chemistries include reducing chemistries (e.g., $B_2H_6$, $SiH_4$) and tungsten-containing chemistries (e.g., $WF_6$, $WCl_6$). Blocks 450 and 454 may be performed in the same chamber or different chambers. The process shown in FIG. 4B may be performed as part of block 201 in a process as shown in FIGS. 2A-2C. In some embodiments, the reactive chemistry in block 454 is one or more compounds used in a subsequent tungsten deposition operation. In some embodiments, block 450 may be performed as part of block 352 in FIGS. 3A-3C, i.e., after a modulation pretreatment. Block 454 may be referred to as a soak, and is generally a non-plasma operation. Block 450 may form a differential inhibition profile along a feature axis, with block 454 forming a modified differential inhibition profile along the feature axis.

Figure 4C:
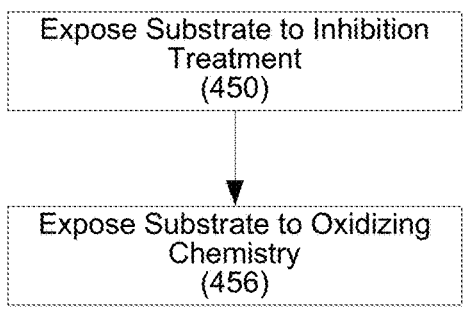

The process of FIG. 4C involves exposing a substrate including a feature to an oxidizing chemistry (456) after exposing it to an inhibition treatment (450) as described above. Examples of oxidizing chemistries include $O_2$, $O_3$, $CO_2$, and $H_2O$. Block 456 may be performed at the same or different temperature than block 450. According to various embodiments, block 456 may or may not involve the use of plasma- or UV-activated species. For example, block 456 may involve exposing the substrate to $O_2$ under non-plasma conditions such that the $O_2$ is not activated. Blocks 450 and 456 may be performed in the same chamber or different chambers. The process shown in FIG. 4C may be performed as part of block 201 in a process as shown in FIGS. 2A-2C. In some embodiments, block 450 may be performed as part of block 352 in FIGS. 3A-3C, i.e., after a modulation pretreatment. Block 450 may form a differential inhibition profile along a feature axis, with block 456 forming a modified differential inhibition profile along the feature axis.

Figure 4D:
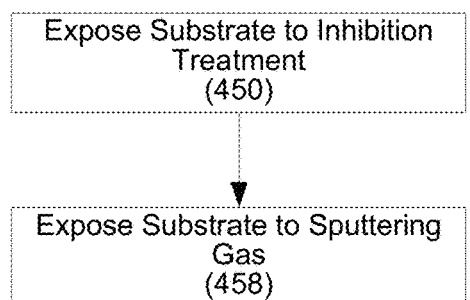

The process of FIG. 4D involves exposing a substrate including a feature to a sputtering gas (458) after exposing it to an inhibition treatment (450) as described above. Examples of sputtering gases include Ar and $H_2$. Blocks 450 and 458 may be performed in the same chamber or different chambers. The process shown in FIG. 4D may be performed as part of block 201 in a process as shown in FIGS. 2A-2C. In some embodiments, block 450 may be performed as part of block 352 in FIGS. 3A-3C, i.e., after a modulation pretreatment. Block 450 may form a differential inhibition profile along a feature axis, with block 458 forming a modified differential inhibition profile along the feature axis.

Figure 4E:
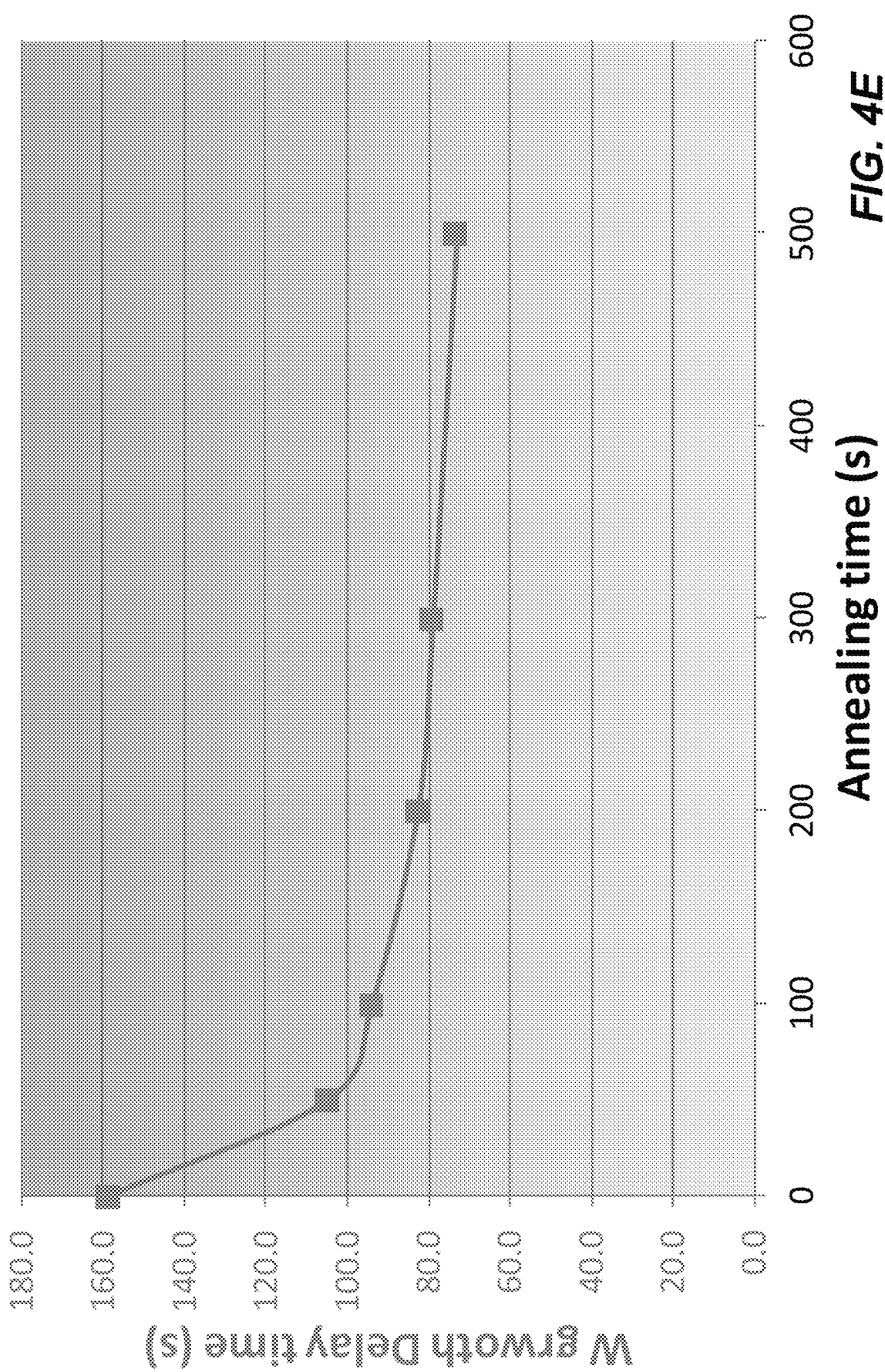
FIG. 4E is a graph showing inhibition modulation as a function of post-inhibition anneal duration.

FIG. 4E shows growth delay of a tungsten deposition performed after the following sequence: a) deposition of a tungsten layer, b) exposure to a nitrogen-based plasma inhibiting treatment, and c) exposure to a thermal anneal. As shown in FIG. 4E, annealing modulates the inhibition effect of the nitrogen plasma by lessening the effect.

Table 2, below, compares inhibition prior to a diborane soak with inhibition performed prior to no soak. For both processes, a tungsten layer was deposited, followed by exposure to a nitrogen plasma, followed by a soak/no soak operation.

| Post-inhibition $B_2H_6$ soaking (seconds) | W deposition thickness (Å) | W growth delay (seconds) |
| --- | --- | --- |
| 0 | 564 | 1044 |
| 3 | 3187 | 170 |

The results in Table 2 indicate that the post-inhibition $B_2H_6$ soaking modulates the inhibition effect by decreasing it. This may be because the soaking with a reactive gas increases the nucleation sites.

Figure 4F:
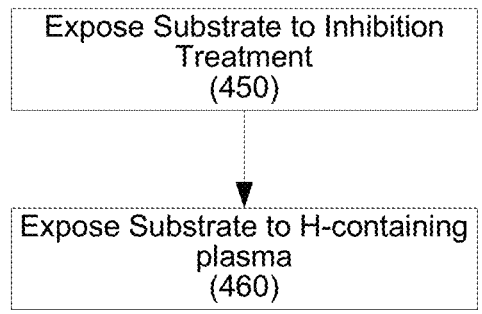
Figure 4G:
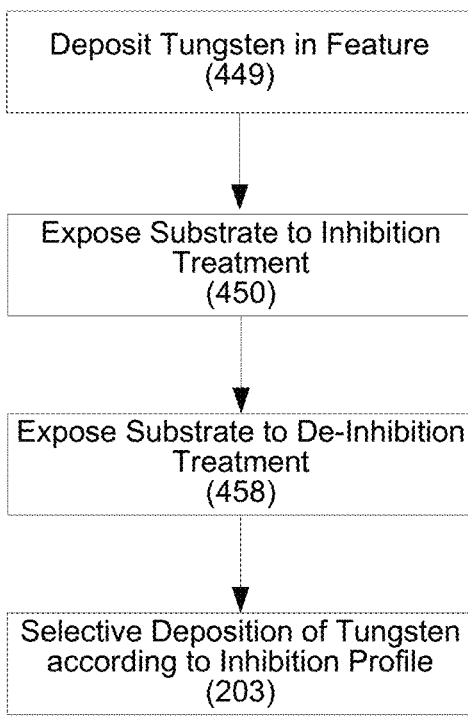
Figure 4H:
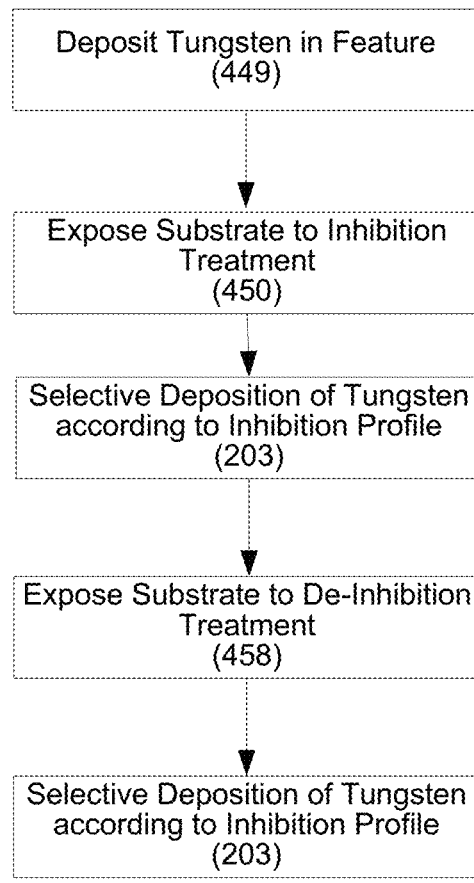
Figure 4I:
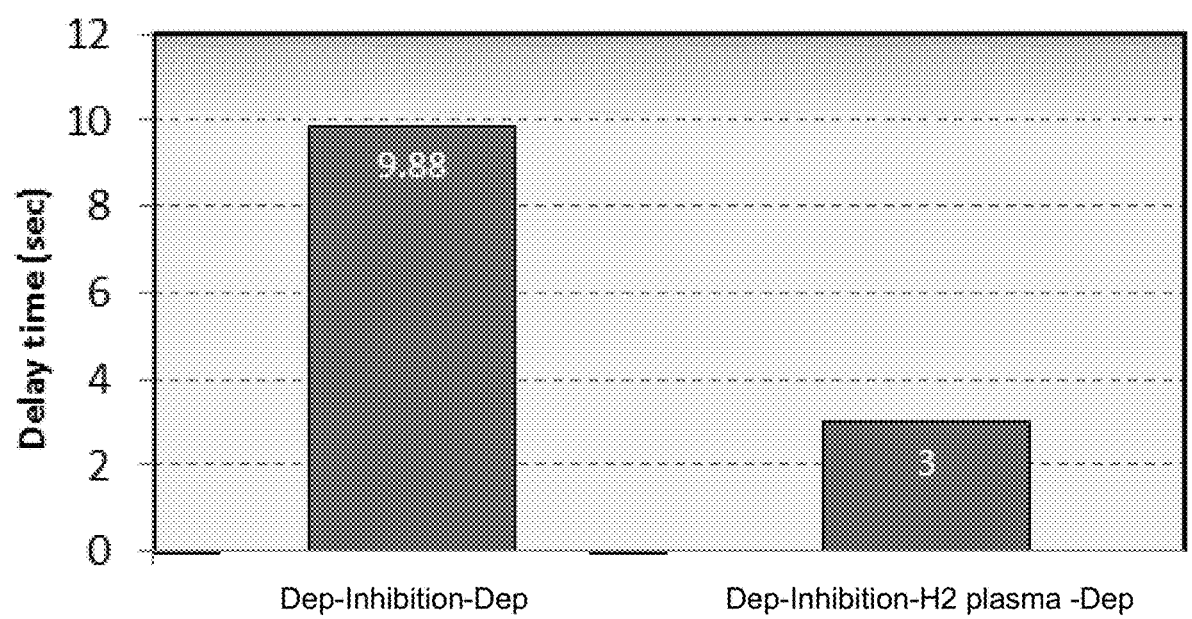
FIG. 4I is a bar graph showing the effect of a post-inhibition hydrogen plasma on inhibition.

The process of FIG. 4F involves exposing a substrate including a feature to an H-containing plasma (460) after exposing it to an inhibition treatment (450) as described above. Examples of H-containing plasmas include remote and in situ plasmas generated from hydrogen ($H_2$) gas. Blocks 450 and 460 may be performed in the same chamber or different chambers. The process shown in FIG. 4F may be performed as part of block 201 in a process as shown in FIGS. 2A-2C. In some embodiments, block 450 may be performed as part of block 352 in FIGS. 3A-3C, i.e., after a modulation pretreatment. Block 450 may form a differential inhibition profile along a feature axis, with block 460 forming a modified differential inhibition profile along the feature axis. FIG. 4I shows delay time from a deposition-inhibition-deposition process as compared to a deposition-inhibition-H2 plasma-deposition process. As shown in FIG. 4I, exposure to the H2 plasma reduces the inhibition effect.

Various post-inhibition treatments above may be used to decrease the inhibition effect and can be referred to as "de-inhibition" treatments. FIGS. 4G and 4H are examples of flow charts that show operations in using such treatments to fill a feature with tungsten. In FIG. 4G, tungsten is deposited in a feature (449). Block 449 involves partially filling the feature with tungsten. In some embodiments, block 449 involves depositing a thin conformal film as described above with respect to block 301 of FIG. 2B. The substrate is then exposed to an inhibition treatment (450) as described above. After exposing the substrate to an inhibition treatment, the substrate is exposed to a de-inhibition treatment that reduces the inhibition effect. Examples of de-inhibition treatments are given above and include an H-containing plasma, a reducing agent thermal soak, and a thermal anneal. Selective deposition of tungsten in then performed in accordance with the inhibition profile (203) as described above.

In FIG. 4H, blocks 449 and 450 are performed as described above with respect to FIG. 4G. After block 450, a selective deposition is performed in accordance with the inhibition profile obtained in block 450 (203). The selective deposition is followed by exposing the substrate to a de-inhibition treatment (458) as described above. Another selective deposition of tungsten is performed in accordance with the inhibition profile obtained in block 458 (203). In some embodiments, block 458 may remove the inhibition effect, such the deposition in block 203 is not preferential or selective to a particular region of the feature.

The process shown in FIG. 4G can be used to reduce the inhibition effect across all features to be filled on a substrate. The process shown in FIG. 4H allows complete fill of some features, e.g., narrow or high aspect ratio or otherwise challenging features before reducing the inhibition effect on partially filled features.

As described above, aspects of the disclosure can be used for VNAND wordline (WL) fill. While the below discussion provides a framework for various methods, the methods are not so limited and can be implemented in other applications as well, including logic and memory contact fill, DRAM buried wordline fill, vertically integrated memory gate/wordline fill, and 3D integration (TSV).

FIG. 1F, described above, provides an example of a VNAND wordline structure to be filled. As discussed above, feature fill of these structures can present several challenges including constrictions presented by pillar placement. In addition, a high feature density can cause a loading effect such that reactants are used up prior to complete fill.

Figure 5:
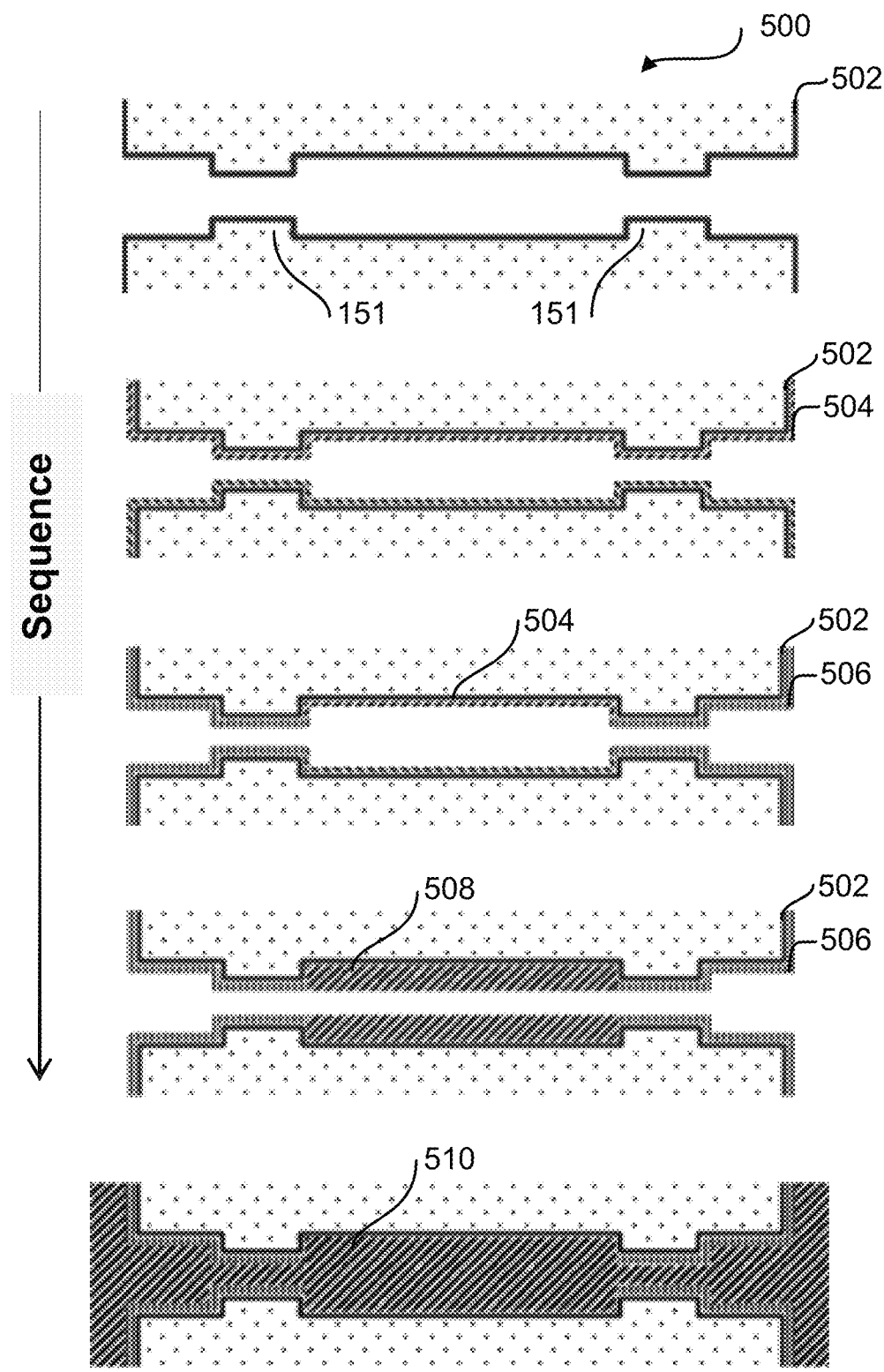
FIGS. 5-7 are schematic diagrams showing features at various stages of feature fill.

Various methods are described below for void-free fill through the entire WL. In certain embodiments, low resistivity tungsten is deposited. FIG. 5 shows a sequence in which non-conformal selective inhibition is used to fill in the interior of the feature before pinch off. In FIG. 5, a structure 500 is provided with a liner layer surface 502. The liner layer surface 502 may be for example, TiN or WN. Next, a W nucleation layer 504 is conformally deposited on the liner layer 502. A PNL process as described above can be used. Note that in some embodiments, this operation of depositing a conformal nucleation layer may be omitted. Next, the structure is exposed to an inhibition chemistry to selectively inhibit portions 506 of the structure 500. In this example, the portions 508 through the pillar constrictions 151 are selectively inhibited. Inhibition can involve for example, exposure to a direct (in-situ) plasma generated from a gas such as $N_2$, $H_2$, forming gas, $NH_3$, $O_2$, $CH_4$, etc. Other methods of exposing the feature to inhibition species are described above. Next, a CVD process is performed to selectively deposit tungsten in accordance with the inhibition profile: bulk tungsten 510 is preferentially deposited on the non-inhibited portions of the nucleation layer 504, such that hard-to-fill regions behind constrictions are filled. The remainder of the feature is then filled with bulk tungsten 510. As described above with reference to FIG. 2A, the same CVD process used to selectively deposit tungsten may be used to remainder of the feature, or a different CVD process using a different chemistry or process conditions and/or performed after a nucleation layer is deposited may be used.

Figure 6:
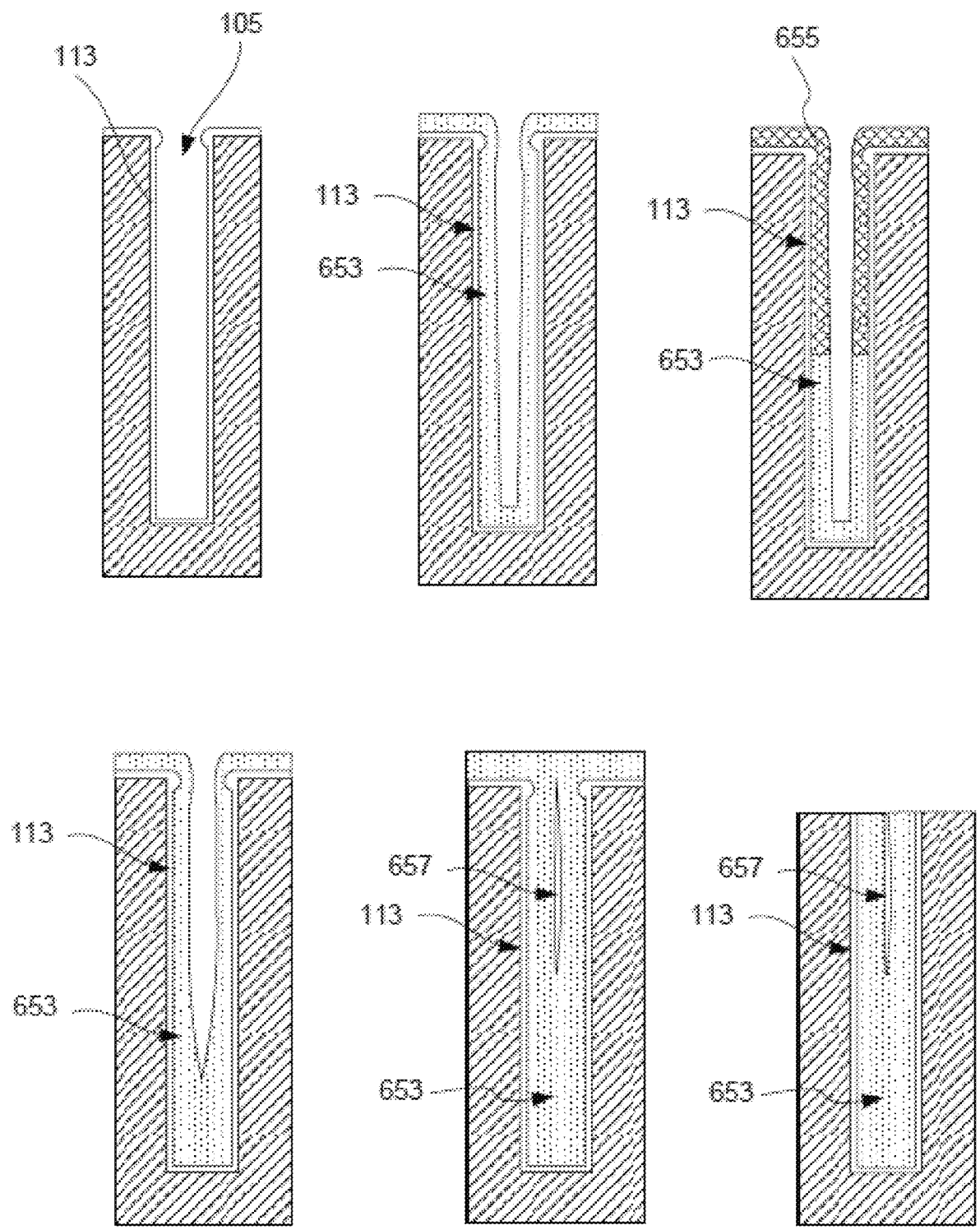

In some embodiments, methods described herein may be used for tungsten via fill. FIG. 6 shows an example of a feature hole 105 including an underlayer 113, which can be, for example, a metal nitride or other barrier layer. A tungsten layer 653 is conformally deposited in the feature hole 10, for example, by a PNL and/or CVD method. (Note that while the tungsten layer 653 is conformally deposited in the feature hole 105 in the example of FIG. 6, in some other embodiments, tungsten nucleation on the underlayer 113 can be selectively inhibited prior to selective deposition of the tungsten layer 653.) Further deposition on the tungsten layer 653 is then selectively inhibited, forming inhibited portion 655 of the tungsten layer 653 near the feature opening. Tungsten is then selectively deposited by a PNL and/or CVD method in accordance with the inhibition profile such that tungsten is preferentially deposited near the bottom and mid-section of the feature. Deposition continues, in some embodiments with one or more selective inhibition cycles, until the feature is filled. As described above, in some embodiments, the inhibition effect at the feature top can be overcome by a long enough deposition time, while in some embodiments, an additional nucleation layer deposition or other treatment may be performed to lessen or remove the passivation at the feature opening once deposition there is desired. Note that in some embodiments, feature fill may still include formation of a seam, such as seam 657 depicted in FIG. 6. In other embodiments, the feature fill may be void-free and seam-free. Even if a seam is present, it may be smaller than obtained with a conventionally filled feature, reducing the problem of coring during CMP. The sequence depicted in the example of FIG. 6 ends post-CMP with a relatively small void present.

Figure 7:
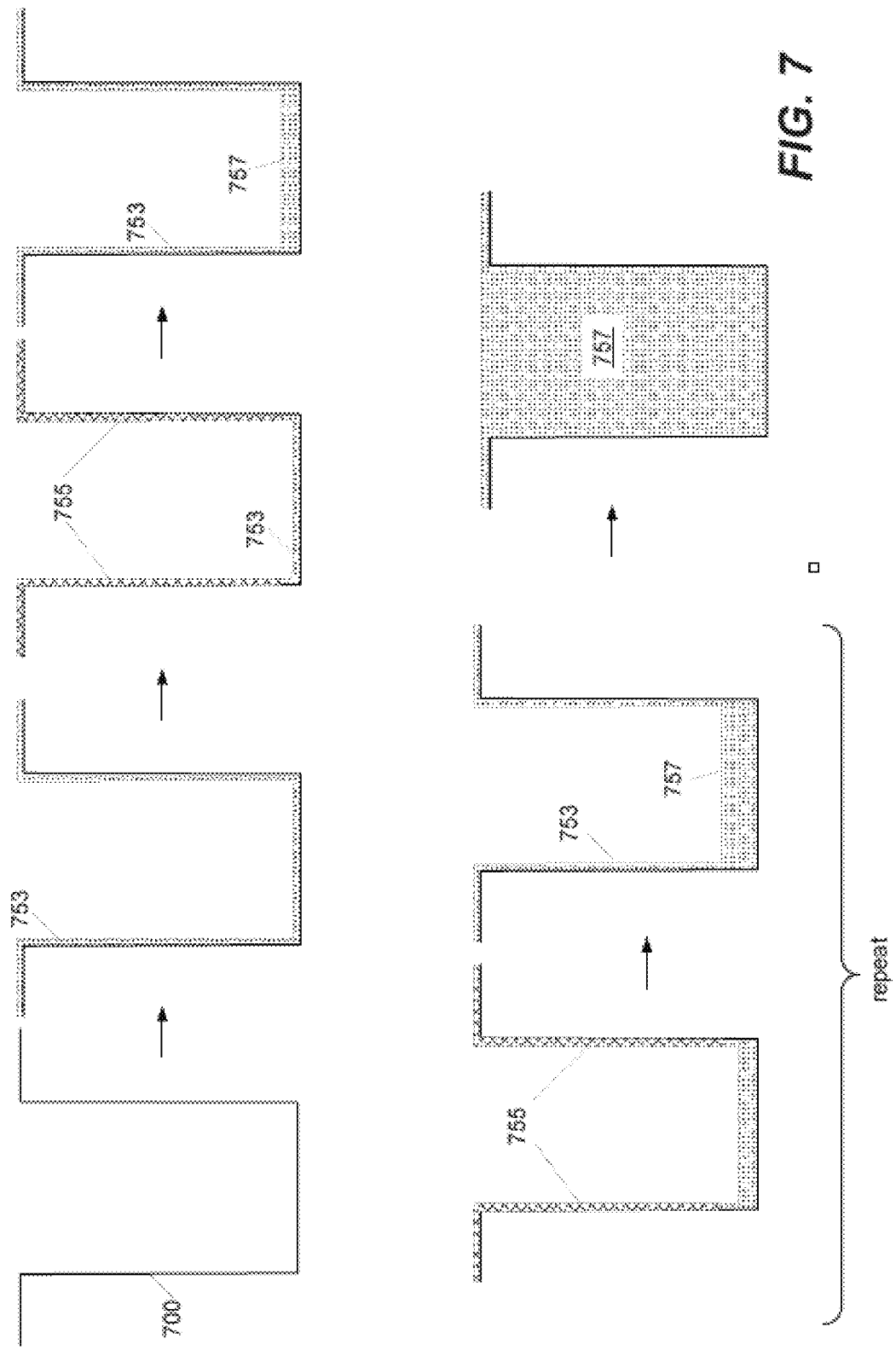

In some embodiments, the processes described herein may be used advantageously even for features that do not have constrictions or possible pinch-off points. For example, the processes may be used for bottom-up, rather than conformal, fill of a feature. FIG. 7 depicts a sequence in which a feature 700 is filled by a method according to certain embodiments. A thin conformal layer of tungsten 753 is deposited initially, followed by selective inhibition to form inhibited portions 755, layer 753 at the bottom of the feature not treated. CVD deposition results in a bulk film 757 deposited on at the bottom of the feature. This is then followed by repeated cycles of selective CVD deposition and selective inhibition until the feature is filled with bulk tungsten 757. Because nucleation on the sidewalls of the feature is inhibited except near the bottom of the feature, fill is bottom-up. In some embodiments, different parameters may be used in successive inhibitions to tune the inhibition profile appropriately as the bottom of the feature grows closer to the feature opening. For example, a bias power and/or treatment time may be decreased is successive inhibition treatments.

Experimental

3D VNAND features similar to the schematic depiction in FIG. 1F were exposed to plasmas generated from $N_2H_2$ gas after deposition of an initial tungsten seed layer. The substrate was biased with a DC bias, with bias power varied from 100 W to 700 W and exposure time varied between 20 s and 200 s. Longer time resulted in deeper and wider inhibition, with higher bias power resulting in deeper inhibition.

Table 1 shows effect of treatment time. All inhibition treatments used exposure to a direct LFRF 2000 W $N_2H_2$ plasma with a DC bias of 100 W on the substrate.

TABLE 1

Effect of treatment time on inhibition profile

| | Initial Tungsten Layer | Inhibition Treatment Time | Subsequent Deposition | Selective Deposition |
|---|---|---|---|---|
| A | Nucleation + 30 s CVD at 300° C. | None | 400 s CVD at 300° C. | Non-selective deposition |
| B | same as A | 60 s | same as A | Non-selective deposition |
| C | same as A | 90 s | same as A | Yes - deposition only from bottom of feature to slightly less than vertical midpoint. Lateral deposition (wider) at bottom of feature. |
| D | same as A | 140 s | same as A | No deposition |

While varying treatment time resulted in vertical and lateral tuning of inhibition profile as described in Table 1 (split C), varying bias power correlated higher to vertical tuning of inhibition profile, with lateral variation a secondary effect.

As described above, the inhibition effect may be overcome by certain CVD conditions, including longer CVD time and/or higher temperatures, more aggressive chemistry, etc. Table 2 below, shows the effect of CVD time on selective deposition.

TABLE 2

Effect of CVD time on selective deposition

| Initial Tungsten Layer | Inhibition Treatment | Subsequent CVD Deposition Time (300° C.) | Selective Deposition |
|---|---|---|---|
| E | Nucleation + 30 s CVD at 300° C. | $H_2N_2$ 2000 W RF direct plasma, 90 s, 100 W DC bias | 0 | no deposition |
| F | same as E | same as E | 200 s | Yes - small amount of deposition extending about ⅙ height of feature from bottom |
| G | same as E | same as E | 400 s | Yes - deposition only from bottom of feature to slightly less than vertical midpoint. Lateral deposition wider at bottom of feature. |
| H | same as E | same as E | 700 s | Yes - deposition through full height of feature, with lateral deposition wider at bottom of feature |

Apparatus

Any suitable chamber may be used to implement this novel method. Examples of deposition apparatuses include various systems, e.g., ALTUS and ALTUS Max, available from Lam Research, Inc. of Fremont, Calif., or any of a variety of other commercially available processing systems.

Figure 8:
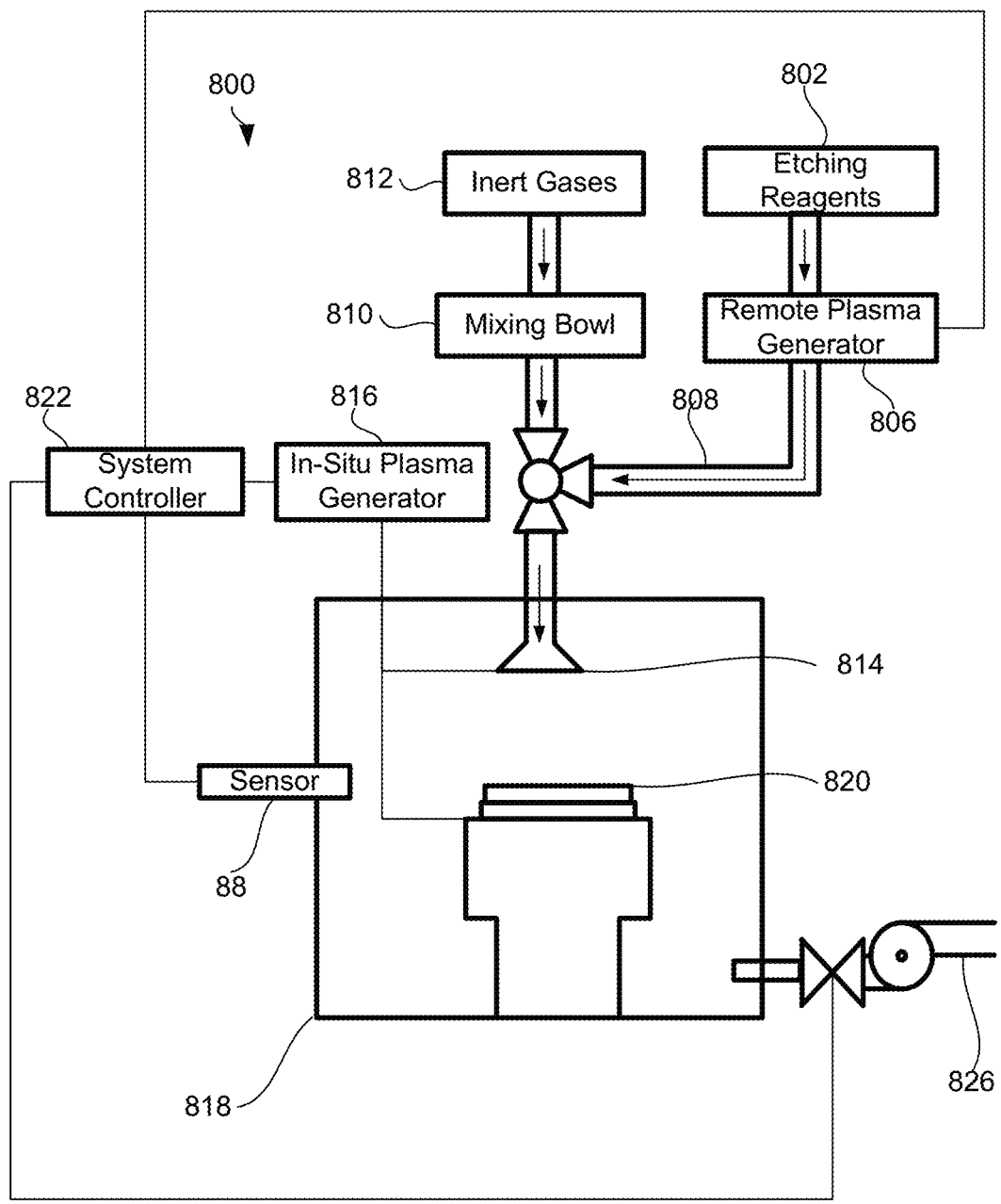
FIGS. 8, 9A and 9B are schematic diagrams showing examples of apparatus suitable for practicing the methods described herein.

FIG. 8 illustrates a schematic representation of an apparatus 800 for processing a partially fabricated semiconductor substrate in accordance with certain embodiments. The apparatus 800 includes a chamber 818 with a pedestal 820, a shower head 814, and an in-situ plasma generator 816. The apparatus 800 also includes a system controller 822 to receive input and/or supply control signals to various devices.

In certain embodiments, a inhibition gas and, if present, inert gases, such as argon, helium and others, can be supplied to the remote plasma generator 806 from a source 802, which may be a storage tank. Any suitable remote plasma generator may be used for activating the etchant before introducing it into the chamber 818. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Mass., may be used. An RPC unit is typically a self-contained device generating weakly ionized plasma using the supplied etchant. Imbedded into the RPC unit a high power RF generator provides energy to the electrons in the plasma. This energy is then transferred to the neutral inhibition gas molecules leading to temperature in the order of 2000K causing thermal dissociation of these molecules. An RPC unit may dissociate more than 60% of incoming molecules because of its high RF energy and special channel geometry causing the gas to adsorb most of this energy.

In certain embodiments, an inhibition gas is flown from the remote plasma generator 806 through a connecting line 808 into the chamber 818, where the mixture is distributed through the shower head 814. In other embodiments, an inhibition gas is flown into the chamber 818 directly completely bypassing the remote plasma generator 806 (e.g., the system 800 does not include such generator). Alternatively, the remote plasma generator 806 may be turned off while flowing the inhibition gas into the chamber 818, for example, because activation of the inhibition gas is not needed or will be supplied by an in situ plasma generator.

The shower head 814 or the pedestal 820 typically may have an internal plasma generator 816 attached to it. In one example, the generator 816 is a High Frequency (HF) generator capable of providing between about 0 W and 10,000 W at frequencies between about 1 MHz and 100 MHz. In another example, the generator 816 is a Low Frequency (LF) generator capable of providing between about 0 W and 10,000 W at frequencies as low as about 100 KHz. In a more specific embodiment, a HF generator may deliver between about 0 W to 5,000 W at about 13.56 MHz. The RF generator 816 may generate in-situ plasma to active inhibition species. In certain embodiments, the RF generator 816 can be used with the remote plasma generator 806 or not used. In certain embodiments, no plasma generator is used during deposition.

The chamber 818 may include a sensor 824 for sensing various process parameters, such as degree of deposition, concentrations, pressure, temperature, and others. The sensor 824 may provide information on chamber conditions during the process to the system controller 822. Examples of the sensor 824 include mass flow controllers, pressure sensors, thermocouples, and others. The sensor 824 may also include an infra-red detector or optical detector to monitor presence of gases in the chamber and control measures.

Deposition and selective inhibition operations can generate various volatile species that are evacuated from the chamber 818. Moreover, processing is performed at certain predetermined pressure levels the chamber 818. Both of these functions are achieved using a vacuum outlet 826, which may be a vacuum pump.

In certain embodiments, a system controller 822 is employed to control process parameters. The system controller 822 typically includes one or more memory devices and one or more processors. The processor may include a CPU or computer, analog and/or digital input/output connections, stepper motor controller boards, etc. Typically there will be a user interface associated with system controller 822. The user interface may include a display screen, graphical software displays of the apparatus and/or process conditions, and user input devices such as pointing devices, keyboards, touch screens, microphones, etc.

In certain embodiments, the system controller 822 controls the substrate temperature, inhibition gas flow rate, power output of the remote plasma generator 806 and/or in situ plasma generator 816, pressure inside the chamber 818 and other process parameters. The system controller 822 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, inhibition gas flow rates, inhibition modulation gas flow rates, etc. These parameters are provided to the user in the form of a recipe, and may be entered utilizing the user interface. Signals for monitoring the process may be provided by analog and/or digital input connections of the system controller 822. The signals for controlling the process are output on the analog and digital output connections of the apparatus 800. Further description of a system controller such as system controller 822 is provided below.

Multi-Station Apparatus

Figure 9A:
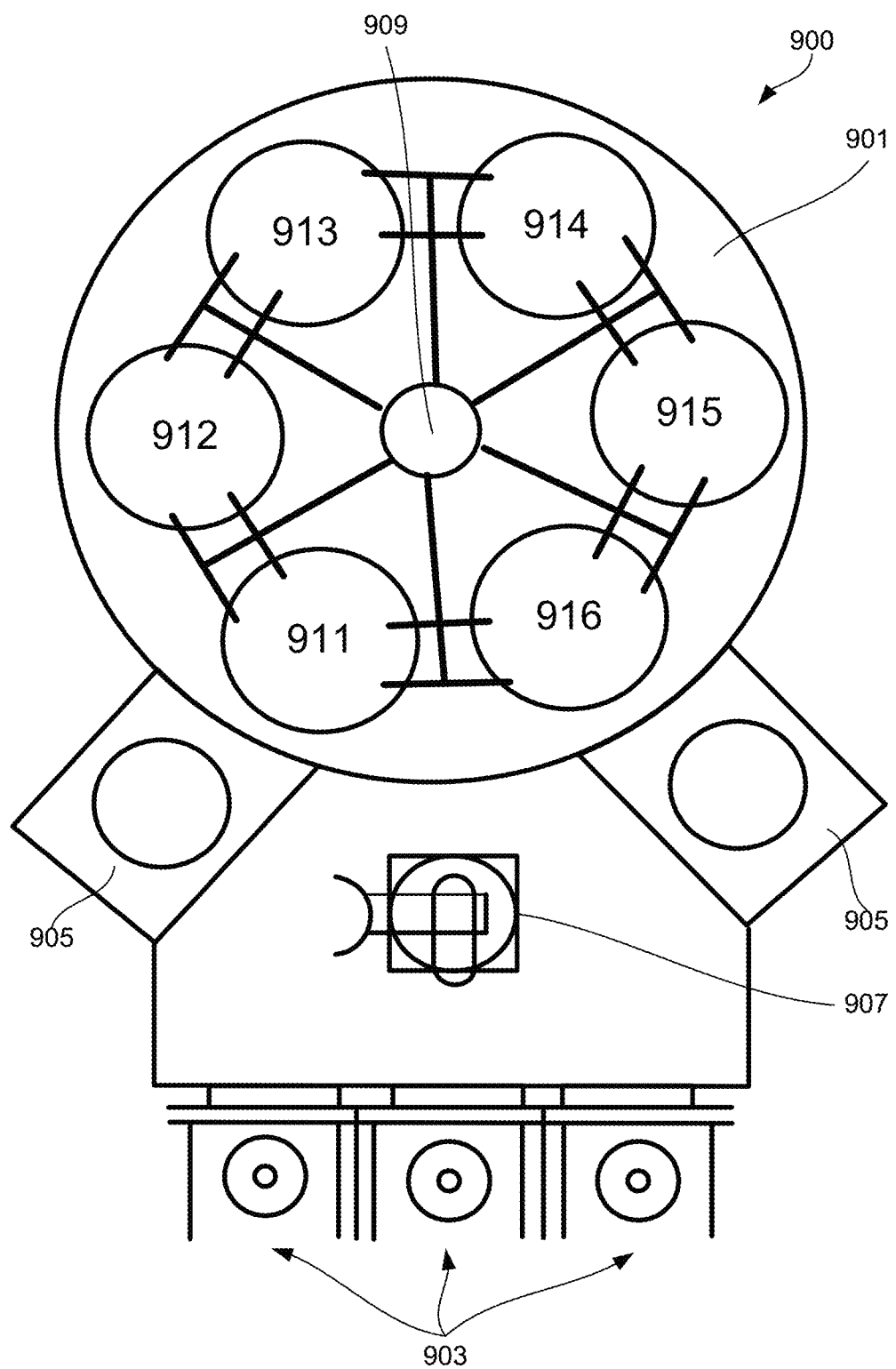

FIG. 9A shows an example of a multi-station apparatus 900. The apparatus 900 includes a process chamber 901 and one or more cassettes 903 (e.g., Front Opening Unified Pods) for holding substrates to be processed and substrates that have completed processing. The chamber 901 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 9A illustrates the process chamber 901 that includes six stations, labeled 911 through 916. All stations in the multi-station apparatus 900 with a single process chamber 903 are exposed to the same pressure environment. However, each station may have a designated reactant distribution system and local plasma and heating conditions achieved by a dedicated plasma generator and pedestal, such as the ones illustrated in FIG. 8.

A substrate to be processed is loaded from one of the cassettes 903 through a load-lock 905 into the station 911. An external robot 907 may be used to transfer the substrate from the cassette 903 and into the load-lock 905. In the depicted embodiment, there are two separate load locks 905. These are typically equipped with substrate transferring devices to move substrates from the load-lock 905 (once the pressure is equilibrated to a level corresponding to the internal environment of the process chamber 903) into the station 911 and from the station 916 back into the load-lock 905 for removal from the processing chamber 903. A mechanism 909 is used to transfer substrates among the processing stations 911-916 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIG. 8. For example, a station 911 may receive a substrate from a load-lock and be used to pre-heat the substrate before being further processed. Other stations may be used for filling high aspect ratio features including deposition and selective inhibition operations.

After the substrate is heated or otherwise processed at the station 911, the substrate is moved successively to the processing stations 912, 913, 914, 915, and 916, which may or may not be arranged sequentially. The multi-station apparatus 900 can be configured such that all stations are exposed to the same pressure environment. In so doing, the substrates are transferred from the station 911 to other stations in the chamber 901 without a need for transfer ports, such as load-locks.

In certain embodiments, one or more stations may be used to fill features with tungsten-containing materials. For example, stations 912 may be used for an initial deposition operation, station 913 may be used for a corresponding selective inhibition operation. In the embodiments where a deposition-inhibition cycle is repeated, stations 914 may be used for another deposition operations and station 915 may be used for another inhibition operation. Section 916 may be used for the final filling operation. It should be understood that any configurations of station designations to specific processes (heating, filling, and removal) may be used. In some implementations, any of the stations can be dedicated to one or more of PNL (or ALD) deposition, selective inhibition, pre- or post-inhibition modulation treatments, and CVD deposition.

As an alternative to the multi-station apparatus described above, the method may be implemented in a single substrate chamber or a multi-station chamber processing a substrate(s) in a single processing station in batch mode (i.e., non-sequential). In this aspect of the invention, the substrate is loaded into the chamber and positioned on the pedestal of the single processing station (whether it is an apparatus having only one processing station or an apparatus having multi-stations running in batch mode). The substrate may be then heated and the deposition operation may be conducted. The process conditions in the chamber may be then adjusted and the selective inhibition of the deposited layer is then performed. The process may continue with one or more deposition-inhibition cycles (if performed) and with the final filling operation all performed on the same station. Alternatively, a single station apparatus may be first used to perform only one of the operation in the new method (e.g., depositing, selective inhibition, final filling) on multiple substrates after which the substrates may be returned back to the same station or moved to a different station (e.g., of a different apparatus) to perform one or more of the remaining operations.

Multi-Chamber Apparatus

Figure 9B:
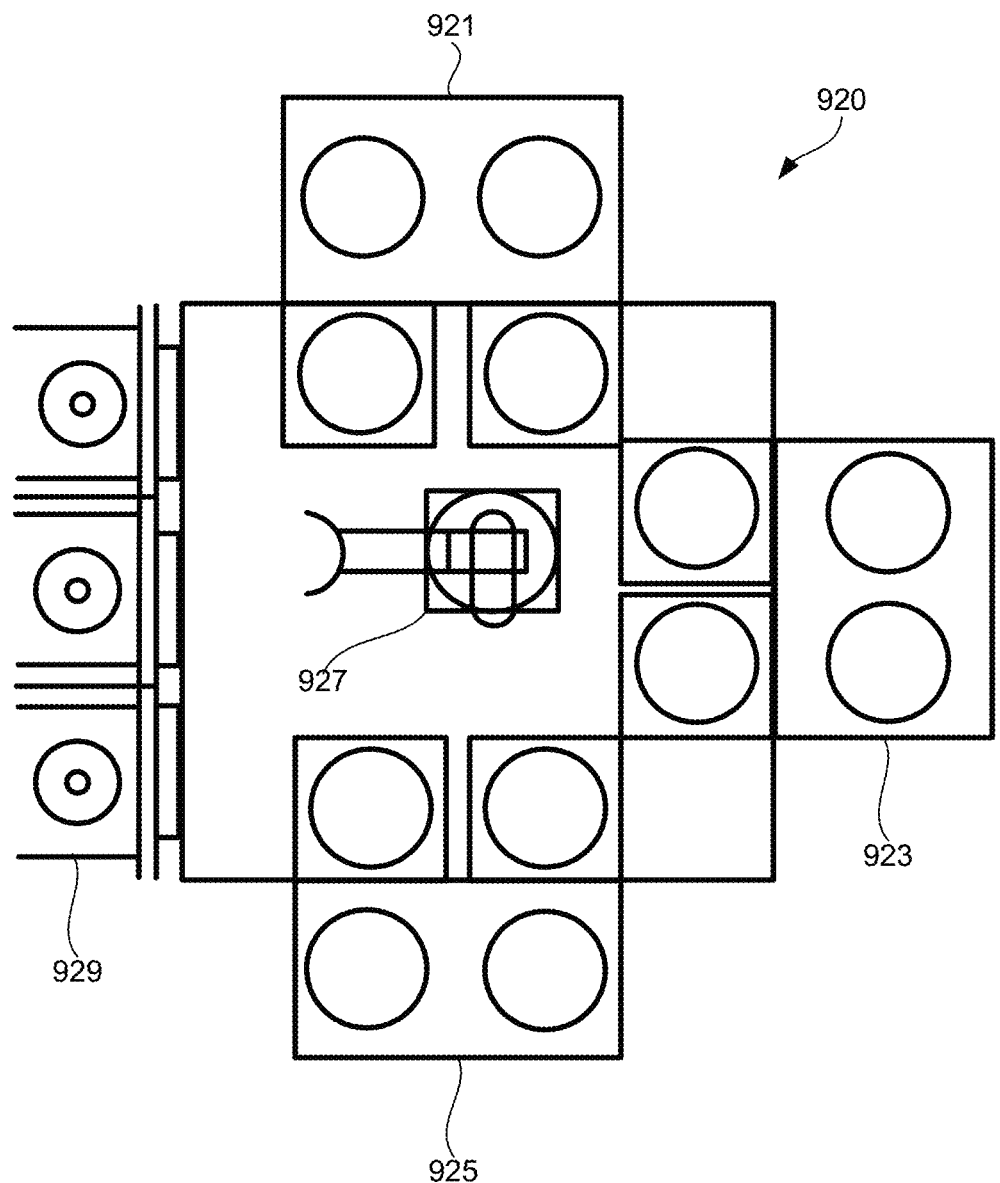

FIG. 9B is a schematic illustration of a multi-chamber apparatus 920 that may be used in accordance with certain embodiments. As shown, the apparatus 920 has three separate chambers 921, 923, and 925. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 921-525 has its own pressure environment, which is not shared between chambers. Each chamber may have one or more corresponding transfer ports (e.g., load-locks). The apparatus may also have a shared substrate handling robot 927 for transferring substrates between the transfer ports one or more cassettes 929.

As noted above, separate chambers may be used for depositing tungsten containing materials and selective inhibition of these deposited materials in later operations. Separating these two operations into different chambers can help to substantially improve processing speeds by maintaining the same environmental conditions in each chamber. A chamber does not need to change its environment from conditions used for deposition to conditions used for selective inhibition and back, which may involve different chemistries, different temperatures, pressures, and other process parameters. In certain embodiments, it is faster to transfer partially manufactured semiconductor substrates between two or more different chambers than changing environmental conditions of these chambers.

Figure 10:
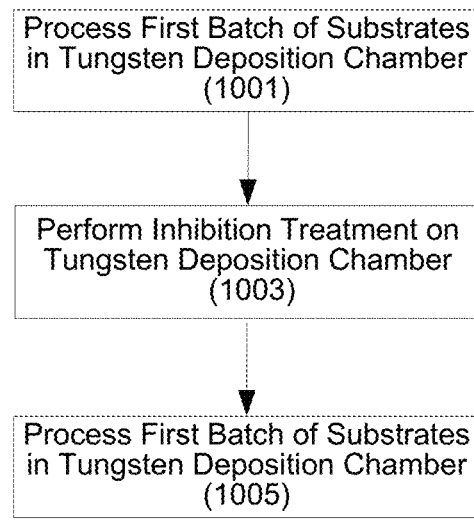
FIG. 10 shows a process diagram illustrating operations in a method of cleaning a deposition chamber.

FIG. 10 shows a process diagram illustrating operations in a method of cleaning a deposition chamber. First, a batch of substrates is processed in a tungsten deposition chamber (1001). Block 1001 may involve a CVD process as described above, for example. Next, an inhibition treatment is performed (1003). Examples of inhibition treatments are given above, and include exposure to nitrogen plasmas. A next batch of substrates may then be processed, with deposition on the chamber inhibited by the inhibition treatment (1005). Block 1003 may be performed with no substrate or a dummy substrate present in the chamber. It may also be performed as part of regular maintenance process that may include any of cleaning the chamber using an etchant chemistry and depositing a precoat or undercoat.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including power, intensity, and exposure times. In an integrated tool, the controller may also control processes such as processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). The system software may be designed or configured in many different ways. For example, various chamber component subroutines or control objects may be written to control operation of the chamber components necessary to carry out the inventive processes. Examples of programs or sections of programs for this purpose include substrate positioning code, treatment compound control code, pressure control code, heater control code, and RF control code. In one embodiment, the controller includes instructions for performing processes of the disclosed embodiments according to methods described above. The computer program code for controlling the processes can be written in any conventional computer readable programming language: for example, assembly language, C, C++, Pascal, Fortran, or others. Compiled object code or script is executed by the processor to perform the tasks identified in the program.

Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory. There may be a user interface associated with controller. The user interface may include a display screen, graphical software displays of the apparatus and/or process conditions, and user input devices such as pointing devices, keyboards, touch screens, microphones, etc.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The invention claimed is:

1. A method comprising:
   providing a substrate including a feature having one or more feature openings and a feature interior;
   exposing the feature to at least one of: an oxidizing environment, a vacuum break, a reducing agent soak, and a tungsten-containing agent soak;
   after exposing the feature and prior to depositing tungsten in the feature, selectively inhibiting tungsten nucleation in the feature such that there is a differential inhibition profile along a feature axis; and
   selectively depositing tungsten in the feature in accordance with the differential inhibition profile, wherein exposing the feature comprises exposing a tungsten bulk layer or a non-tungsten surface to the at least one of an oxidizing environment, a vacuum break, a reducing agent soak, and a tungsten-containing agent soak.

2. The method of claim 1, wherein selectively inhibiting tungsten nucleation in the feature comprises exposing the feature to a direct plasma while applying a bias to the substrate.

3. The method of claim 2, wherein the plasma contains one or more of nitrogen, hydrogen, oxygen and carbon activated species.

4. The method of claim 1, wherein selectively inhibiting tungsten nucleation in the feature comprises a non-plasma process.

5. The method of claim 4, wherein the non-plasma process comprises exposing the feature to a non-plasma nitrogen-containing gas.

6. The method of claim 1, wherein exposing the feature to one of: an oxidizing environment, a vacuum break, a reducing agent soak, and a tungsten-containing agent soak comprises a reducing agent soak.

7. The method of claim 6, wherein the reducing agent is one of a diborane and silane.

8. The method of claim 1, wherein selectively inhibiting tungsten nucleation in the feature comprises exposing the feature to a remote plasma.

9. The method of claim 6, wherein the reducing agent soak comprises adsorbing reducing agent species on the feature surface.

10. The method of claim 9, wherein the reducing agent soak increases the inhibition.

11. The method of claim 1, wherein exposing the feature to one of: an oxidizing environment, a vacuum break, a reducing agent soak, and a tungsten-containing agent soak comprises exposing the feature to an oxidizing environment.

12. The method of claim 1, wherein exposing the feature to one of: a vacuum break, a reducing agent soak, and a tungsten-containing agent soak comprises exposing the feature to a vacuum break.

13. The method of claim 1, wherein exposing the feature to one of: an oxidizing environment, a vacuum break, a reducing agent soak, and a tungsten-containing agent soak comprises exposing the feature to a tungsten-containing agent soak.

* * * * *